US012689351B2

(12) United States Patent     (10) Patent No.:   US 12,689,351 B2

Kanazawa     (45) Date of Patent:    Jul. 21, 2026

---

(54) ELASTIC WAVE DEVICE, COMMUNICATION DEVICE, AND PIEZOELECTRIC SUBSTRATE

(71) Applicant: KYOCERA Corporation, Kyoto (JP)

(72) Inventor: Tomio Kanazawa, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 19/043,975

(22) Filed: Feb. 3, 2025

(65) Prior Publication Data

US 2026/0005668 A1    Jan. 1, 2026

Related U.S. Application Data

(63) Continuation of application No. PCT/JP2024/044792, filed on Dec. 18, 2024.

(30) Foreign Application Priority Data

Jun. 27, 2024    (JP) ................................. 2024-104227

(51) Int. Cl.
*H03H 9/02*     (2006.01)
*H03H 9/145*     (2006.01)
*H03H 9/25*     (2006.01)

(52) U.S. Cl.
CPC .... *H03H 9/02842* (2013.01); *H03H 9/02574* (2013.01); *H03H 9/145* (2013.01); *H03H 9/25* (2013.01)

(58) Field of Classification Search
CPC ........... H03H 9/02842; H03H 9/02574; H03H 9/145; H03H 9/25
USPC ...... 310/313 R, 313 A, 313 B, 313 C, 313 D
See application file for complete search history.

(56) References Cited

U.S. PATENT DOCUMENTS

| 2017/0373241 A1 | 12/2017 | Kimura |
| 2018/0254763 A1* | 9/2018 | Yamamoto ........... H03H 9/6483 |
| 2020/0395914 A1* | 12/2020 | Okunaga ............ H03H 9/02228 |
| 2021/0098683 A1 | 4/2021 | Iwabuchi et al. |
| 2023/0031568 A1 | 2/2023 | Tang et al. |
| 2023/0111032 A1 | 4/2023 | Goto et al. |
| 2023/0113099 A1 | 4/2023 | Goto et al. |
| 2024/0305265 A1 | 9/2024 | Ushiyama et al. |

FOREIGN PATENT DOCUMENTS

| JP | 2021-052359 A | 4/2021 |
| WO | 2016/185772 A1 | 11/2016 |

* cited by examiner

*Primary Examiner* — Derek J Rosenau

(74) *Attorney, Agent, or Firm* — Volpe Koenig

(57)        ABSTRACT

To improve frequency characteristics of an elastic wave device. The elastic wave device includes a piezoelectric body having a first surface and an electrode including an IDT electrode on the first surface. The piezoelectric body has a first end surface connected to the first surface, the first end surface being an end surface positioned on a first side in a first direction that is orthogonal to an extending direction of any of electrode fingers. A first angle formed by an extended line of the first surface and a tangential line at any point on the first end surface is less than 90°.

29 Claims, 16 Drawing Sheets

ELASTIC WAVE DEVICE, COMMUNICATION DEVICE, AND PIEZOELECTRIC SUBSTRATE

TECHNICAL FIELD

The present disclosure relates to an elastic wave device, a communication device including the elastic wave device, and a piezoelectric substrate.

BACKGROUND OF INVENTION

Patent Document 1 discloses a configuration example of an elastic wave device.

CITATION LIST

Patent Literature

Patent Document 1: WO 2016/185772

SUMMARY

In a first aspect of the present disclosure, an elastic wave device includes a piezoelectric body having a first surface; and an electrode including an IDT electrode including a plurality of electrode fingers arrayed on the first surface, in which the piezoelectric body has a first end surface connected to the first surface, the first end surface being an end surface positioned on a first side in a first direction orthogonal to an extending direction of any of the plurality of electrode fingers among directions parallel to the first surface, and on a cross-section obtained by cutting the piezoelectric body on a plane parallel to the first direction and perpendicular to the first surface, a first angle formed by an extended line of the first surface in the first direction and a tangential line at any point on the first end surface is 70° or greater and less than 90°.

In another aspect of the present disclosure, an elastic wave device includes a piezoelectric body having a first surface; and an electrode including an IDT electrode including a plurality of electrode fingers arrayed on the first surface, in which the piezoelectric body has a first end surface connected to the first surface, the first end surface being an end surface positioned on a first side in a first direction orthogonal to an extending direction of any of the plurality of electrode fingers among directions parallel to the first surface, on a cross-section obtained by cutting the piezoelectric body on a plane parallel to the first direction and perpendicular to the first surface, a first angle formed by an extended line of the first surface in the first direction and a tangential line at any point on the first end surface is less than 90°, and when an average value of intervals of the plurality of electrode fingers in the first direction is set to p, a height of the first end surface is 0.5 p or higher and 2.0 p or less.

In another aspect of the present disclosure, an elastic wave device includes a support substrate; a piezoelectric body positioned on the support substrate and having a first surface opposite to the support substrate; and an electrode including an IDT electrode including a plurality of electrode fingers arrayed on the first surface, in which the piezoelectric body has a first end surface connected to the first surface, the first end surface being an end surface positioned on a first side in a first direction orthogonal to an extending direction of any of the plurality of electrode fingers among directions parallel to the first surface, on a cross-section obtained by cutting the piezoelectric body on a plane parallel to the first direction and perpendicular to the first surface, a first angle formed by an extended line of the first surface in the first direction and a tangential line at any point on the first end surface is less than 90°, and when an average value of intervals of the plurality of electrode fingers in the first direction is set to p, a height from a lower surface of the support substrate opposite to the first surface to the first surface is 0.5 p or higher and 2.0 p or less.

In another aspect of the present disclosure, an elastic wave device includes a piezoelectric body having a first surface; and an electrode including an IDT electrode including a plurality of electrode fingers arrayed on the first surface, in which the piezoelectric body has a first end surface connected to the first surface, the first end surface being an end surface positioned on a first side in a first direction orthogonal to an extending direction of any of the plurality of electrode fingers among directions parallel to the first surface, on a cross-section obtained by cutting the piezoelectric body on a plane parallel to the first direction and perpendicular to the first surface, a first angle formed by an extended line of the first surface in the first direction and a tangential line at any point on the first end surface is less than 90°, the electrode includes an end-portion electrode closest to the first end surface, and when an average value of intervals of the plurality of electrode fingers in the first direction is set to p, a shortest distance between the end-portion electrode and the first end surface is 5 p or shorter.

In another aspect of the present disclosure, a piezoelectric substrate includes a piezoelectric body having a first surface, in which the piezoelectric body has a first end surface connected to the first surface, the first end surface being an end surface positioned on a first side in a first direction that is a direction parallel to the first surface, and on a cross-section obtained by cutting the piezoelectric body on a plane parallel to the first direction and perpendicular to the first surface, a first angle formed by an extended line of the first surface in the first direction and a tangential line at any point on the first end surface is 70° or greater and less than 90°.

DESCRIPTION OF EMBODIMENTS

First Embodiment

An elastic wave device according to the present embodiment will be described below in detail. For convenience of description, a component having the same function as that described in the first embodiment will be denoted by the same reference sign in each of subsequent embodiments, and a description thereof will not be repeated. For simplicity, descriptions of known technical matters will be omitted as appropriate. Each component, material, and numerical value described herein is an example only, unless otherwise inconsistent. Thus, for example, unless otherwise inconsistent, the positional relationship of each component is not limited to the examples in each drawing. The illustration of each component is not necessarily to scale.

Overview of Elastic Wave Device

Figure 2:
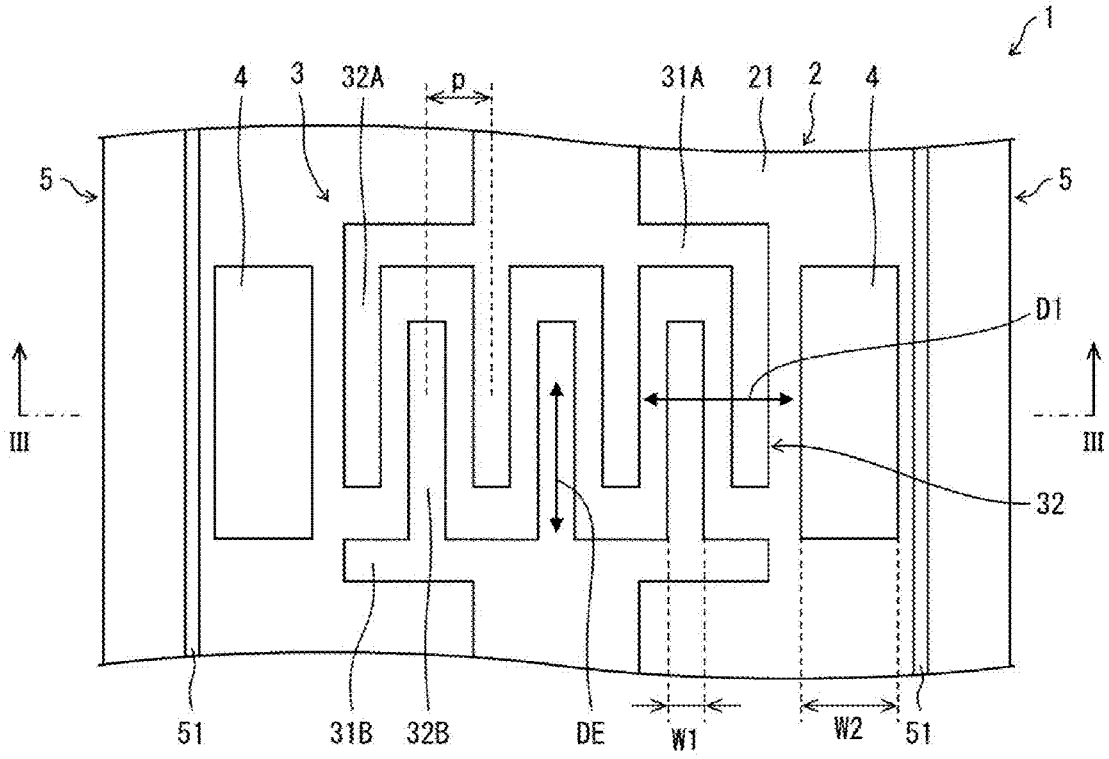
FIG. 2 is a schematic plan view of the elastic wave device according to the first embodiment of the present disclosure.
Figure 3:
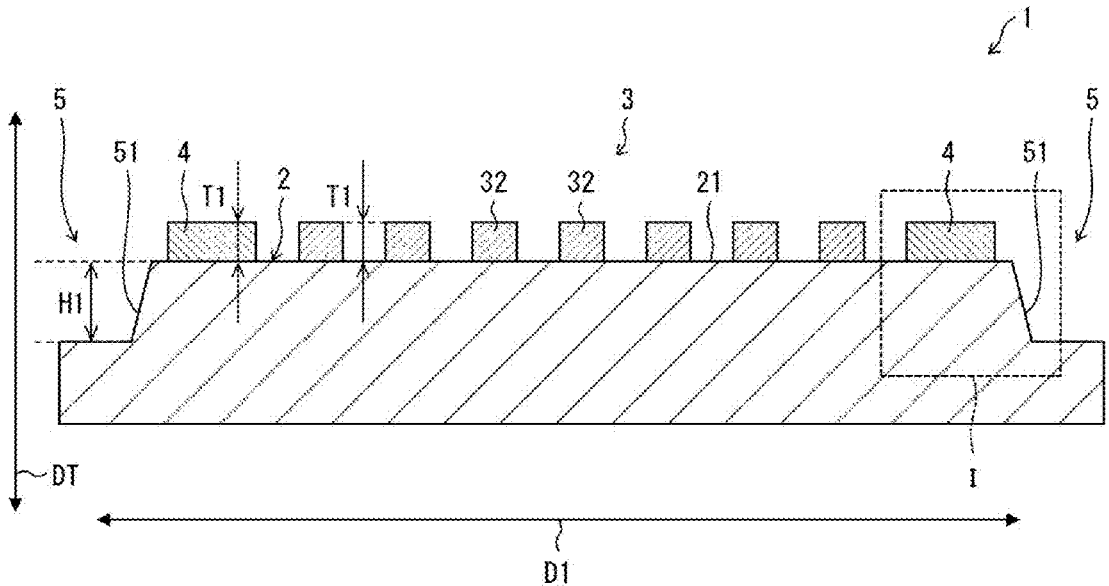
FIG. 3 is a schematic side cross-sectional view of the elastic wave device according to the first embodiment of the present disclosure.

FIG. 2 is a schematic plan view of an elastic wave device 1 according to the present embodiment. FIG. 3 is a schematic cross-sectional view of the elastic wave device 1 according to the present embodiment, and particularly is a cross-sectional view taken along arrow line III-III shown in FIG. 2. In other words, FIG. 3 is a side cross-sectional view of the elastic wave device 1 on a plane parallel to a first direction D1 to be described below and a thickness direction DT and a plane passing through a plurality of electrode fingers 32 and floating electrodes 4. In other words, the side cross-sectional view illustrated in FIG. 3 shows a cross-section obtained by cutting a piezoelectric body 2 in a plane parallel to a first direction D1 to be described below and perpendicular to a first surface 21. In the present disclosure, for simplification of description, a case in which the elastic wave device 1 is one elastic wave element or one elastic wave resonator will be described. However, the configuration is not limited thereto, and the elastic wave device 1 according to the present disclosure may include a plurality of elastic wave elements or elastic wave resonators arrayed in parallel.

As illustrated in FIGS. 2 and 3, the elastic wave device 1 includes the piezoelectric body 2. The piezoelectric body 2 may be made of a single crystal material. Examples of the piezoelectric body 2 include lithium tantalate ($LiTaO_3$) that is called LT and lithium niobate ($LiNbO_3$) that is called LN. In the present disclosure, a case in which the piezoelectric body 2 is made of LT is mainly exemplified. In the present disclosure, the substrate including the piezoelectric body 2 is also referred to as a piezoelectric substrate.

The piezoelectric body 2 has a first surface 21. The first surface 21 is, for example, the upper surface of the piezoelectric body 2 in the film thickness direction DT. In the present embodiment, the film thickness direction DT is a flat surface perpendicular to the first surface 21. The elastic wave device 1 includes an interdigital transducer (IDT) electrode 3 positioned on the first surface 21 of the piezoelectric body 2. The IDT electrode 3 excites elastic waves, and is also referred to as an excitation electrode.

The IDT electrode 3 includes, for example, a bus bar 31A extending on the first surface 21 and a bus bar 31B facing the bus bar 31A and extending in substantially the same direction as the extending direction of the bus bar 31A. In addition, the IDT electrode 3 includes a plurality of electrode fingers 32 including an electrode finger 32A extending from the bus bar 31A toward the bus bar 31B and an electrode finger 32B extending from the bus bar 31B toward the bus bar 31A. The extending direction DE of the electrode finger 32A and the electrode finger 32B may be, for example, the direction orthogonal to the extending direction of the bus bar 31A or the bus bar 31B. In the present disclosure, "two directions are the same" or "two directions are parallel" does not indicate only the case in which two directions are strictly parallel. In the present disclosure, for example, "extending directions of two members are the same" allows the extending directions of the two members to be different from each other within a range of a manufacturing error of the two members.

The electrode fingers 32A and 32B are alternately positioned at intervals of a pitch p in a first direction D1 orthogonal to the extending direction DE among directions parallel to the first surface 21, for example. In the present disclosure, the pitch p refers to the distance, in the first direction D1, between the centers of two electrode fingers 32 adjacent to each other in the first direction D1. Thus, the plurality of electrode fingers 32 are arrayed at the pitch p in the first direction D1. In this case, the extending direction of the bus bar 31A and the bus bar 31B may be substantially parallel to the first direction D1.

In the present disclosure, although the case in which each of the interval between two electrode fingers 32 adjacent to each other in the first direction D1 is a constant pitch p is described, the present disclosure is not limited to this. For example, the interval between two electrode fingers 32 adjacent to each other in the first direction D1 may vary depending on the set of the two electrode fingers 32. In this case, the pitch p in the present disclosure may refer to an average value of intervals between two electrode fingers 32 adjacent to each other in the first direction D1.

In the present embodiment, a configuration of the IDT electrode 3 is not limited to the configuration illustrated in FIG. 2. For example, the array direction of the plurality of electrode fingers 32 may be different from the direction orthogonal to the extending direction DE of each electrode finger 32, in other words, may be different from the first direction D1. In this case, the extending direction of the bus bar 31A and the bus bar 31B may be different from the first direction D1. Furthermore, the extending direction DE of each electrode finger 32 may vary depending on the electrode fingers 32. In this case, the first direction D1 may be a direction orthogonal to the extending direction DE of any of the electrode fingers 32.

Each of the electrode fingers 32 has a width W1 along the first direction D1. In the present disclosure, although the case in which the width W1 of all the electrode fingers 32 is constant will be described, the present disclosure is not limited thereto. For example, the widths of the electrode fingers 32 in the first direction D1 may vary depending on the electrode fingers 32. In this case, the width W1 in the present disclosure may refer to the average value of the width of each electrode finger 32 in the first direction D1. In addition, in the present disclosure, a value obtained by dividing the width W1 by the pitch p may be referred to as a duty ratio.

Each of the electrode fingers 32 has a thickness T1 in the film thickness direction DT. In the disclosure, although the case in which the thickness T1 of all electrode fingers 32 is constant will be described, the present disclosure is not limited thereto. For example, the thicknesses of the electrode fingers 32 in the film thickness direction DT may vary depending on the electrode fingers 32. For example, even for the same electrode fingers 32, the thicknesses of the electrode fingers 32 in the film thickness direction DT may vary depending on the positions of the electrode fingers 32. In this case, the thickness T1 may refer to the average value of the thicknesses of the electrode fingers 32 in the thickness direction DT in the present disclosure.

The elastic wave device 1 according to the present embodiment further includes floating electrodes 4. The floating electrodes 4 are positioned on the first surface 21 of the piezoelectric body 2, and are electrically independent from other electrodes on the first surface 21 including the respective portions of the IDT electrode 3. In particular, the floating electrodes 4 are positioned on at least the end portion of the first surface 21 on a first side in the first direction D1 away from the IDT electrode 3. In the present embodiment, the floating electrodes 4 may be positioned at both end portions of the first surface 21 in the first direction D1 away from the IDT electrode 3. The floating electrodes 4 may have a function of improving the reflectance of elastic waves propagating through the piezoelectric body 2.

The floating electrodes 4 have a width W2 in the first direction D1. In the present embodiment, the width W2 is larger than the width W1. In the present embodiment, the thickness of the floating electrodes 4 in the film thickness direction DT may be equal to the thickness T1 of each electrode finger 32 in the film thickness direction DT. In the present disclosure, "the thicknesses of two members are the same" does not indicate only the case in which the thicknesses of the two members are exactly the same, and for example, a difference within a range of a manufacturing error is allowed for the thicknesses of the two members.

End Surface of Elastic Wave Device

The elastic wave device 1 has an end surface 5 located on the first side in the first direction D1. In particular, in the present embodiment, the end surface 5 includes a first end surface 51 in the piezoelectric body 2 and connected to the first surface 21. In other words, the piezoelectric body 2 has the first end surface positioned on the first side in the first direction D1 and connected to the first surface 21. In the present embodiment, the piezoelectric body 2 may have, in addition to the first end surface 51, another end surface that is not connected to the first surface 21 but constitutes a part of the end surface 5. In addition, the elastic wave device 1 may also have another end surface 5 on a second side opposite to the first side in first direction D1. Furthermore, the end surface 5 may include an end surface of a portion of a groove portion of the piezoelectric body 2. Specifically, a portion of the side surface of the groove portion may be a one of the end surface 5. In this case, the side surfaces on both sides of the groove portion can be included in the end surface 5.

In the present embodiment, the first end surface 51 has a height H1 from the lower end to the upper end in the film thickness direction DT. The height H1 includes only the height of the first end surface 51 connected to the first surface 21 among the end surfaces of the piezoelectric body 2 positioned on the side of the first direction D1. In other words, among the end surfaces of the piezoelectric body 2, the height of the other end surface not connected to the first surface 21 does not fall in the height H1. In the present disclosure, "two surfaces are connected" may indicate that any of end portions of the two surfaces are in contact with each other.

Figure 1:
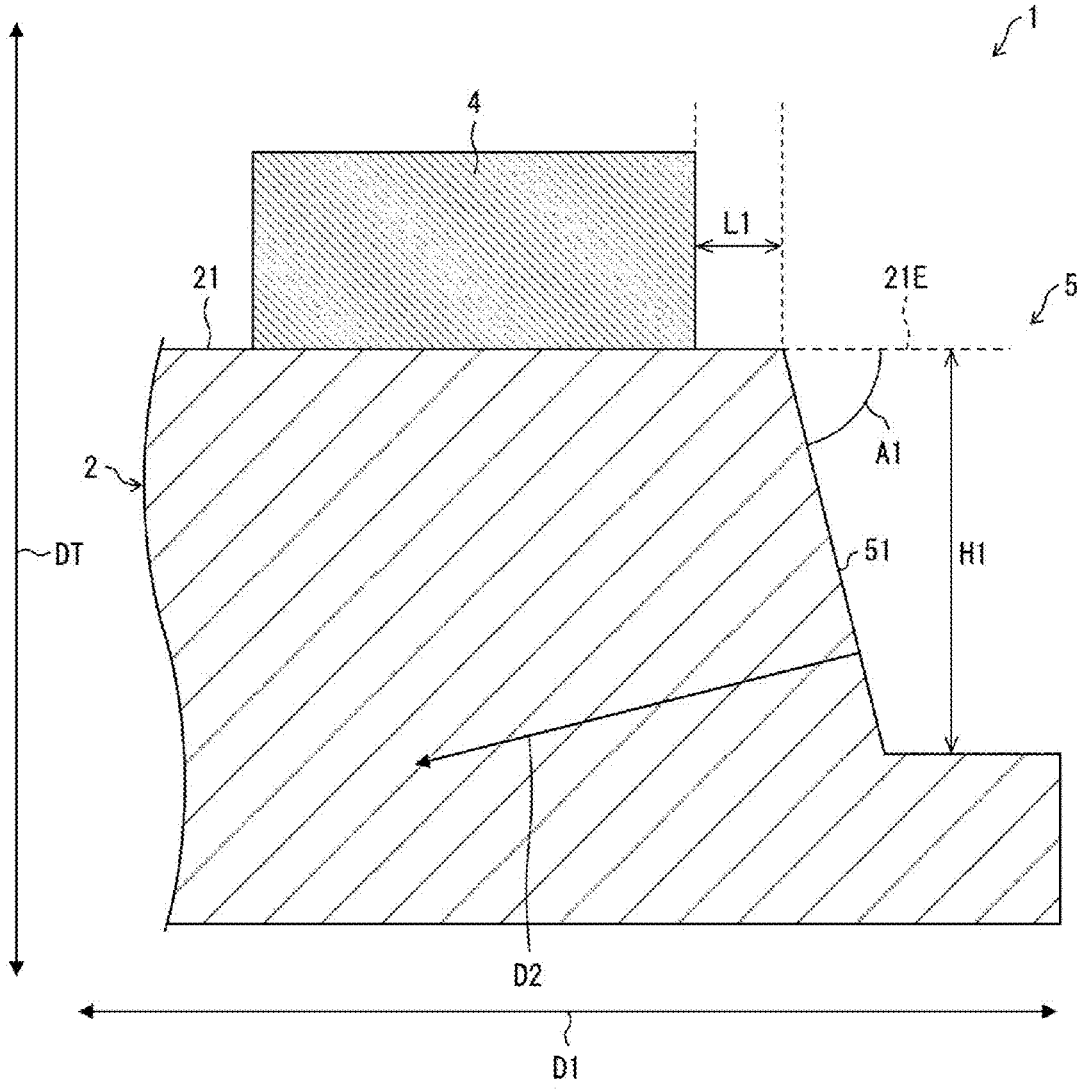
FIG. 1 is a schematic enlarged view of a side cross-section of an elastic wave device according to a first embodiment of the present disclosure.

The configuration of the elastic wave device 1 in the vicinity of the first end surface 51 will be described in detail with reference to FIG. 1. FIG. 1 is a schematic enlarged view of a side cross-section of the elastic wave device 1 according to the present embodiment, and is a schematic view particularly showing an enlargement of a region I shown in FIG. 3, in other words, the vicinity of the first end surface 51 in the end surface 5 on the first side described above. In other words, FIG. 1 illustrates a cross-section obtained by cutting the elastic wave device 1 including the piezoelectric body 2 in a plane parallel to the first direction D1 and perpendicular to the first surface 21. In the present embodiment, the first end surface 51 in the end surface 5 positioned on the above-described second side in the first direction D1 may have the same configuration as the first end surface 51 shown in FIG. 1 except that the left and right sides in the first direction D1 are reversed.

First Angle

In the present embodiment, an extended line of the first surface 21 in the first direction D1 is an extended line 21E as illustrated in FIG. 1. In addition, in a cross-section of the elastic wave device 1 according to the present embodiment parallel to the first direction D1, an angle formed by the extended line 21E and the first end surface 51 on the outer side of the piezoelectric body 2 is referred to as a first angle A1. Although an example in which the first end surface 51 is a flat surface is described in the present disclosure, the present disclosure is not limited thereto, and for example, the first end surface 51 may be a curved surface. In this case, the first angle A1 may be an angle formed by the extended line 21E and a tangent line at any point of the first end surface 51 on the outer side of the piezoelectric body 2.

In the present embodiment, the first angle A1 is smaller than 90°. Here, a direction parallel to the normal direction of the first end surface 51 and extending from the first end surface 51 toward the inside of the piezoelectric body 2 is defined as a second direction D2. In this case, since the first angle A1 is smaller than 90°, a surface of the piezoelectric body 2 on the side opposite to the first surface 21 in the film thickness direction DT, in other words, a portion of the piezoelectric body 2 different from the first surface 21 is positioned in the second direction D2 from any point on the first end surface 51. For this reason, the first end surface 51 does not face the first surface 21 on the inner side of the piezoelectric body 2.

Some of elastic waves excited by the IDT electrode 3 of the elastic wave device 1 and propagating through the piezoelectric body 2 propagate in the array direction of the plurality of electrode fingers 32, for example, in the first direction D1. Furthermore, some of the elastic waves are reflected on the first end surface 51 of the piezoelectric body 2. Thus, the elastic wave device 1 improves the intensity of elastic waves referred to as a main vibration having a desired frequency among elastic waves propagating through the piezoelectric body 2.

On the other hand, elastic waves propagating through the piezoelectric body 2 may include an elastic wave called a spurious signal having a frequency different from the frequency of the main vibration. In general, the frequency characteristics of an elastic wave device can be improved by reducing the intensity of a spurious signal in elastic waves propagating through a piezoelectric body while maintaining the intensity of a main vibration.

As described above, since the first angle A1 is smaller than 90°, when an elastic wave propagating through the piezoelectric body 2 is reflected on the first end surface 51, a part of the elastic wave propagates in the second direction D2 different from the direction from the first end surface 51 toward the first surface 21. For this reason, in the elastic wave device 1, by reflecting an elastic wave propagating through the piezoelectric body 2 on the first end surface 51, part of a spurious signal of the elastic wave is caused to propagate in a direction different from the first surface 21 on which the IDT electrode 3 is positioned and to leak from the piezoelectric body 2 to the outside of the elastic wave device 1. Therefore, the elastic wave device 1 reduces the spurious signal propagating through the piezoelectric body 2.

On the other hand, in the present embodiment, the first angle A1 is 70° or greater. Thus, in the elastic wave device 1, propagation of the main vibration of the elastic waves reflected on the first end surface 51 in a direction different from the first surface 21 is reduced. Therefore, the elastic wave device 1 maintains the intensity of the main vibration propagating through the piezoelectric body 2 even after the elastic wave propagating through the piezoelectric body 2 is reflected on the first end surface 51.

As described above, the elastic wave device 1 in which the first angle A1 is 70° or greater and smaller than 90° reduces the intensity of the spurious signal of the elastic wave propagating through the piezoelectric body 2 while maintaining the intensity of the main vibration. Therefore, the frequency characteristics of the elastic wave device 1 are improved by the above configuration. From the viewpoint of further maintaining the intensity of the main vibration propagating through the piezoelectric body 2, the first angle A1 may be 80° or greater, and further may be 88° or greater. With the above-described configuration, the piezoelectric substrate including the piezoelectric body 2 according to the present embodiment reduces the intensity of the spurious signal of the elastic wave propagating through the piezoelectric body 2 while maintaining the intensity of the main vibration. Therefore, the piezoelectric substrate including the piezoelectric body 2 with the above-described configuration improves the characteristics of the elastic wave propagating through the piezoelectric body 2.

Height of First End Surface

As described above, when the pitch p is the average value of the intervals between the plurality of electrode fingers 32 in the first direction D1, the height H1 of the first end surface 51 is 0.5 p or higher and 2.0 p or less in the present embodiment.

When the height H1 is 2.0 p or less, a part of the spurious signal of the elastic wave propagating through the piezoelectric body 2 may pass through the side opposite to the first surface 21 rather than the first end surface 51. For this reason, in the elastic wave device 1, reflection of part of the spurious signal of the elastic wave propagating through the piezoelectric body 2 on the first end surface 51 is reduced, and the spurious signal is leaked from the piezoelectric body 2 to the outside of the elastic wave device 1. Therefore, the elastic wave device 1 reduces the spurious signal propagating through the piezoelectric body 2. In addition, since the first angle A1 is less than 90° as described above, the elastic wave device 1 further reduces the spurious signal propagating through the piezoelectric body 2.

On the other hand, when the height H1 is 0.5 p or higher, most of the main vibration of the elastic wave propagating through the piezoelectric body 2 is reflected on the first end surface 51. Therefore, the elastic wave device 1 maintains the intensity of the main vibration propagating through the piezoelectric body 2 by reflecting the elastic wave propagating through the piezoelectric body 2 on the first end surface 51.

As described above, the elastic wave device 1 in which the first angle A1 is smaller than 90° and the height H1 is 0.5 p or higher and 2.0 p or less reduces the intensity of the spurious signal of the elastic wave propagating through the piezoelectric body 2 while maintaining the intensity of the main vibration. Therefore, the frequency characteristics of the elastic wave device 1 are improved by the above configuration. From the viewpoint of further maintaining the intensity of the main vibration propagating through the piezoelectric body 2, the first angle A may be 80° or greater.

Distance Between End-Portion Electrode and First End Surface

As described above, the floating electrodes 4 are positioned closer to the end portion of the first surface 21 in the first direction D1 than to the IDT electrode 3. For this reason, in the present embodiment, the floating electrodes 4 are end-portion electrodes closest to the first end surfaces 51 among the electrodes on the first surface 21. The shortest distance between each of the floating electrodes 4 serving as end-portion electrodes and the first end surface 51 is defined as a distance L1. In the present embodiment, when the average value of the intervals between the plurality of electrode fingers 32 in the first direction D1 is assumed to be the pitch p, the distance L1 is 5 p or shorter. In the present disclosure, "the distance L1 is 5 p or shorter" includes a case in which the distance L1 is 0. In other words, the floating electrode 4 which is an end-portion electrode in the present embodiment may be in contact with the end portion of the first end surface 51 on the first surface 21 side.

The distance L1 that is the shortest distance between the floating electrode 4 as an end-portion electrode and the first end surface 51 in the present embodiment being 5 p or shorter corresponds to the fact that the floating electrode 4 is positioned in the vicinity of the first end surface 51. The end-portion electrode has a function of promoting excitation of an elastic wave reflected on the first end surface 51 among elastic waves propagating through the piezoelectric body 2. Thus, the floating electrode 4 positioned in the vicinity of the first end surface 51 promotes excitation of the main vibration of the elastic wave reflected on the first end surface 51. Therefore, the elastic wave device 1 maintains the intensity of the main vibration propagating through the piezoelectric body 2. Moreover, since the first angle A1 is less than 90° as described above, the elastic wave device 1 reduces the spurious signal propagating through the piezoelectric body 2.

As described above, the elastic wave device 1 in which the first angle A1 is smaller than 90° and the distance L1 is 5 p or shorter reduces the intensity of the spurious signal of the elastic wave propagating through the piezoelectric body 2 while maintaining the intensity of the main vibration. Therefore, the frequency characteristics of the elastic wave device 1 are improved by the above configuration. From the viewpoint of further maintaining the strength of the main vibration propagating through the piezoelectric body 2, the distance L1 may be 1 p or shorter, and may further be 0.1 p or shorter.

The floating electrodes 4 according to the present embodiment are end-portion electrodes and are electrically independent from other electrodes different from the floating electrodes 4 among the electrodes positioned on the first surface 21. Therefore, the shape or arrangement pattern of the floating electrodes 4 can be made different from that of the plurality of electrode fingers 32 of the IDT electrode 3 having the function of exciting the main vibration, for example. For this reason, the floating electrodes 4 improve the degree of freedom in designing the electrodes on the first surface 21, and make it possible to design the elastic wave device 1 that further promotes excitation of the main vibration of elastic waves propagating through the piezoelectric body 2, for example.

The floating electrodes 4 are different from the plurality of electrode fingers 32 in shape or arrangement pattern. In particular, the widths W2 of the floating electrodes 4 are larger than the widths W1 which are the average value of the widths of the plurality of electrode fingers 32. For this reason, the floating electrodes 4 may cause excitation of spurious signals of elastic waves propagating in the vicinity. However, in the present embodiment, the floating electrodes 4 are positioned near the first end surfaces 51 having a function of reflecting the spurious signal propagating through the piezoelectric body 2 and leaking the spurious signal to the outside of the elastic wave device 1. For this reason, in the elastic wave device 1, the spurious signals excited in the vicinity of the floating electrodes 4 are efficiently leaked to the outside of the elastic wave device 1 by the first end surfaces 51. Therefore, the elastic wave device 1 reduces the spurious signals propagating through the piezoelectric body 2 more efficiently. In particular, even when the widths W2 are greater than the widths W1, in other words, even when the shapes of the floating electrodes 4 are significantly different from the shapes of the electrode fingers 32, the elastic wave device 1 more efficiently reduces spurious signals propagating through the piezoelectric body 2.

In general, among electrodes on a piezoelectric body in an elastic wave device, a width of an electrode at an endmost portion in a propagation direction of an elastic wave in the piezoelectric body is half of the average value of widths of a plurality of electrode fingers on the piezoelectric body, thereby reducing spurious signals excited in the vicinity of the end-portion electrodes. However, the width W2 in the present embodiment is different from half the width W1, in other words, the width W2 is greater or smaller than half the width W1. On the other hand, as described above, the floating electrodes 4 are positioned in the vicinity of the first end surfaces 51 having the function of reflecting the spurious signals propagating through the piezoelectric body 2 and leaking the spurious signals to the outside of the elastic wave device 1. Therefore, the elastic wave device 1 according to the present embodiment can reduce spurious signals caused by the difference between the width W2 and half the width W1.

Comparative Verification Between Example and Comparative Example: First Angle In order to confirm the improvement of the frequency characteristics of the elastic wave device 1 according to the present embodiment, the frequency characteristics of the elastic wave devices according to an example and a comparative example were compared and verified by simulation.

First, the frequency characteristics of the elastic wave devices according to Example 1, Example 2, and Comparative Example 1 were compared and verified. Each of the elastic wave devices according to Example 1, Example 2, and Comparative Example 1 has the same configuration as the elastic wave device 1 according to the present embodiment except for the value of the first angle A1. In each of the above-described elastic wave devices, the thickness T1 was set to 8% of the total thicknesses of the elastic wave devices, the duty ratio was set to 0.50, the width W2 was set to 1.26 p, the cut angle of the piezoelectric body 2 was set to 42°, and the total number of the electrode fingers 32 was set to 200. In each of Example 1, Example 2, and Comparative Example 1, the first angle A1 was set to 70°, 80°, and 90°.

Figure 4:
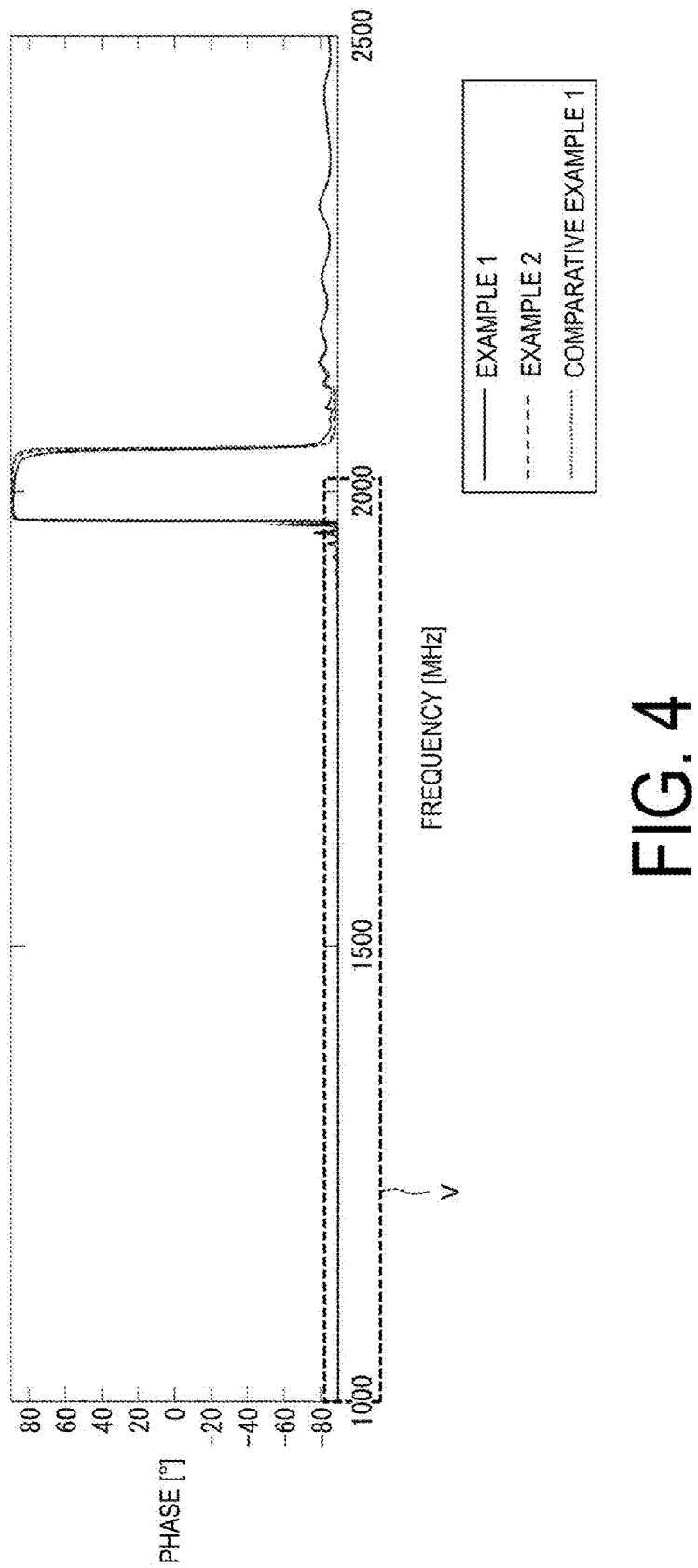
FIG. 4 is a graph showing frequency characteristics of elastic wave devices according to examples and a comparative example of the present disclosure.
Figure 5:
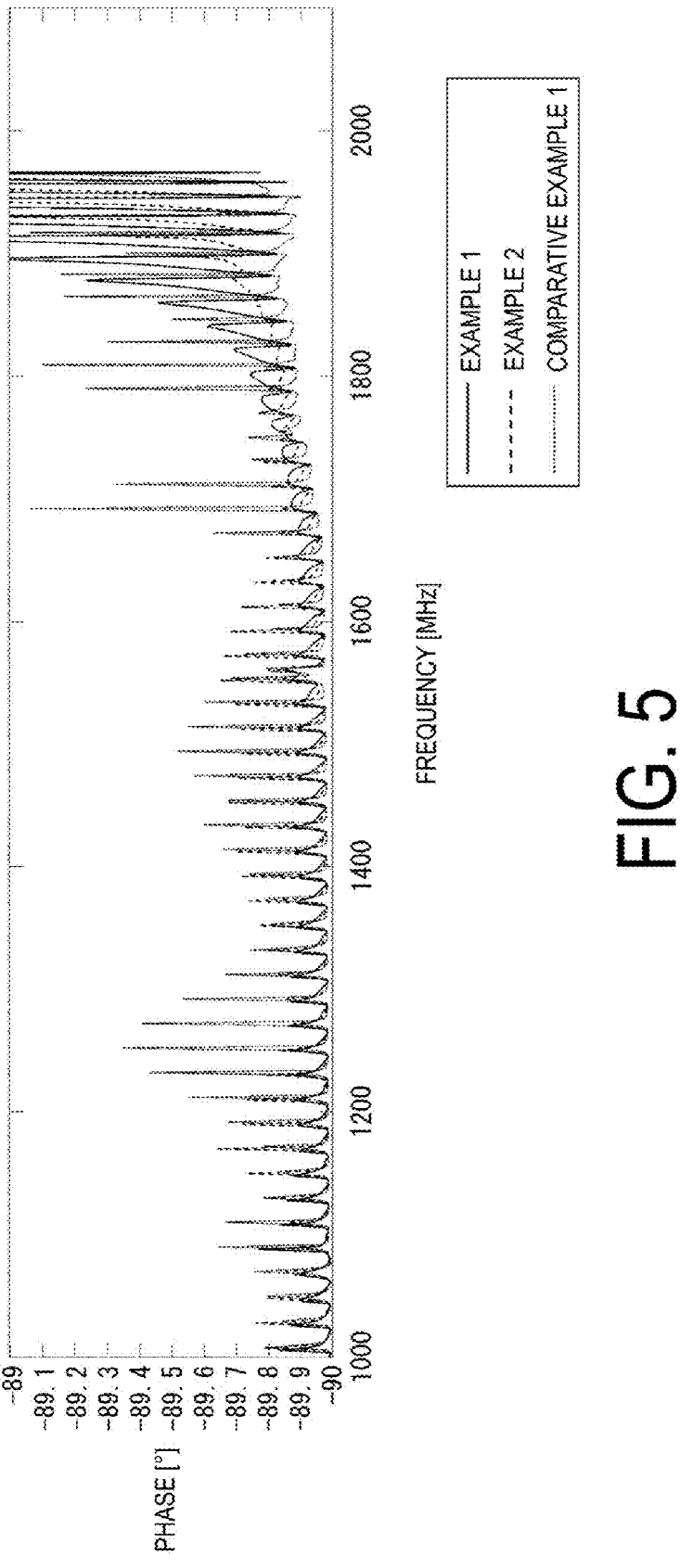
FIG. 5 is an enlarged view of a part of the graph showing the frequency characteristics of the elastic wave devices according to the examples and the comparative example of the present disclosure.

The simulation results of the phase characteristics of the elastic wave devices according to Example 1, Example 2, and Comparative Example 1 are summarized in FIGS. 4 and 5. FIG. 4 is a graph showing phase characteristics of elastic wave devices according to Example 1, Example 2, and Comparative Example 1. FIG. 5 is a graph showing an enlarged region V in the graph shown in FIG. 4. In FIGS. 4 and 5, the phase characteristics of the elastic wave devices according to Example 1, Example 2, and Comparative Example 1 are indicated by a solid line, a broken line, and a dotted line, respectively. In the graphs of FIGS. 4 and 5, the horizontal axes represent frequency, and the vertical axes represent phase of impedance in each elastic wave device. The phase of the impedance in the elastic wave devices is simply expressed "phase" below.

In general, in an elastic wave device, the phase can theoretically take a minimum value of −90° to a maximum value of 90°. In general, in the phase characteristics of an elastic wave device, as the phase at a certain frequency approaches 90°, excitation of an elastic wave having the frequency in the elastic wave device is promoted. On the contrary, in the elastic wave device, as the phase at a certain frequency approaches −90°, excitation of an elastic wave having the frequency in the elastic wave device is reduced. Therefore, in general, the elastic wave device can improve the frequency characteristics by bringing the phase at the frequency corresponding to the main vibration close to 90° and bringing the phase at the frequency corresponding to the spurious signal other than the main vibration close to −90°.

The elastic wave devices according to Example 1, Example 2, and Comparative Example 1 excite elastic waves having frequencies near 2000 MHz as main vibration. As shown in the graph of FIG. 4, the phases near the 2000 MHz in the elastic wave devices according to Example 1 and Example 2 are near 90°, which is substantially the same as the phases near the 2000 MHz in the elastic wave device according to Comparative Example 1. Thus, the elastic wave devices according to Examples 1 and 2 maintain the excitation of the main vibration to some extent as compared with the elastic wave device according to Comparative Example 1.

As shown in the graph of FIG. 4, the phase of the frequency corresponding to the part of the main vibration in the elastic wave device according to Example 2 is larger than the phase of the frequency in the elastic wave device according to Example 1. This means that the larger the first angle A1 is in the present embodiment, the more the main vibration reflected on the first end surface 51 is less likely to leak from the piezoelectric body 2 to the outside of the elastic wave device 1.

On the other hand, in the elastic wave devices according to Example 1, Example 2, and Comparative Example 1, elastic waves having frequencies equal to or lower than about 1970 MHz correspond to spurious signals. As shown in the graph of FIG. 5, in the elastic wave devices according to Examples 1 and 2, the phases of frequencies corresponding to some spurious signals are reduced as compared with the elastic wave device according to Comparative Example 1. Thus, the elastic wave devices according to Examples 1 and 2 reduce the excitation of the spurious signals, as compared with the elastic wave device according to Comparative Example 1.

As shown in the graph of FIG. 5, the phase of the frequency corresponding to the spurious signal in the elastic wave device according to Example 1 tends to be smaller than the phase of the frequency corresponding to the spurious signal in the elastic wave device according to Example 2. This corresponds to the fact that the spurious signal reflected on the first end surface 51 more efficiently leaks from the piezoelectric body 2 to the outside of the elastic wave device 1 as the first angle A1 decreases in the present embodiment.

Comparative Verification Between Example and Comparative Example: Height of First End Surface Next, the frequency characteristics of the elastic wave devices according to Example 3, Example 4, and Example 5 were compared and verified. All the elastic wave devices according to Example 3, Example 4, and Example 5 have the same configuration as the elastic wave device according to Example 2 described above except for the value of the height H1. In Example 3, Example 4, and Example 5, the height H1 was set to 1 p, 1.5 p, and 2 p, respectively.

Figure 6:
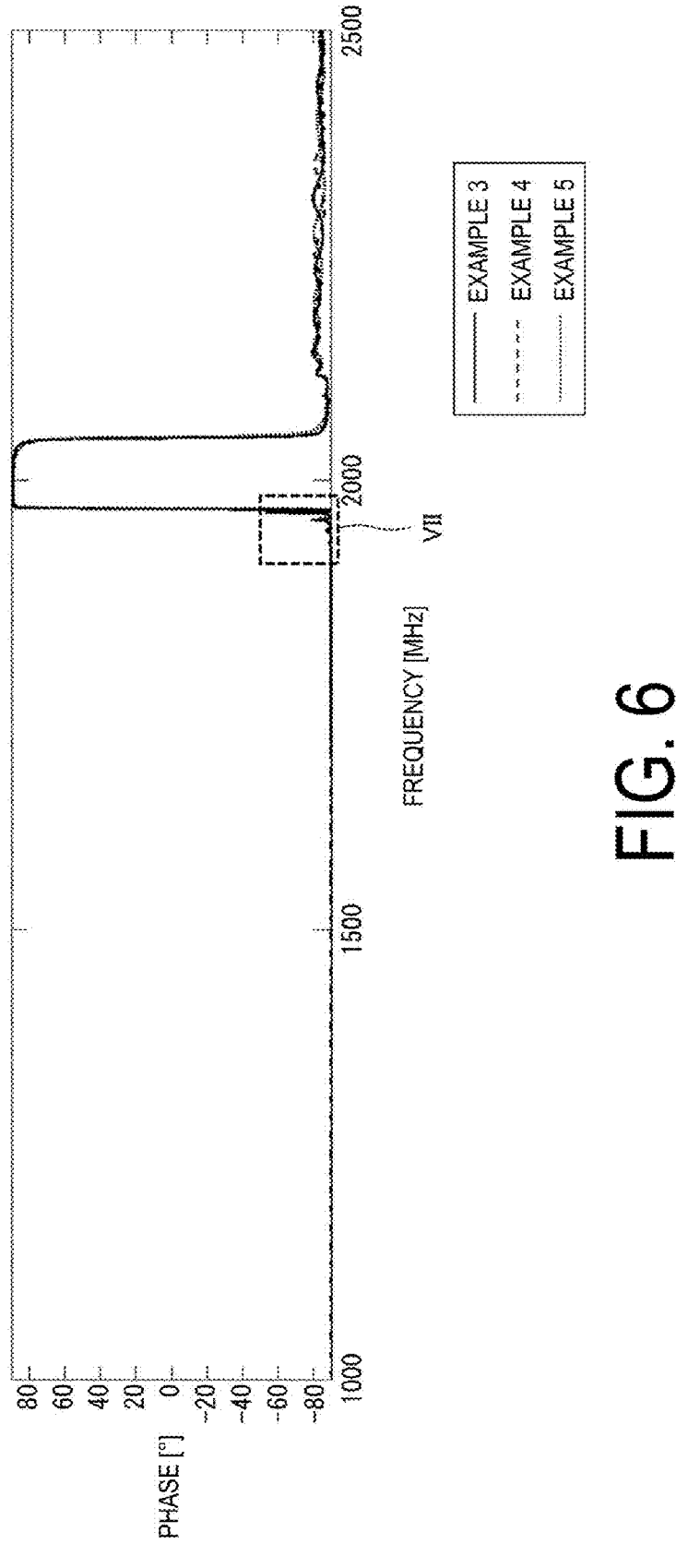
FIG. 6 is a graph showing frequency characteristics of an elastic wave device according to another example of the present disclosure.
Figure 7:
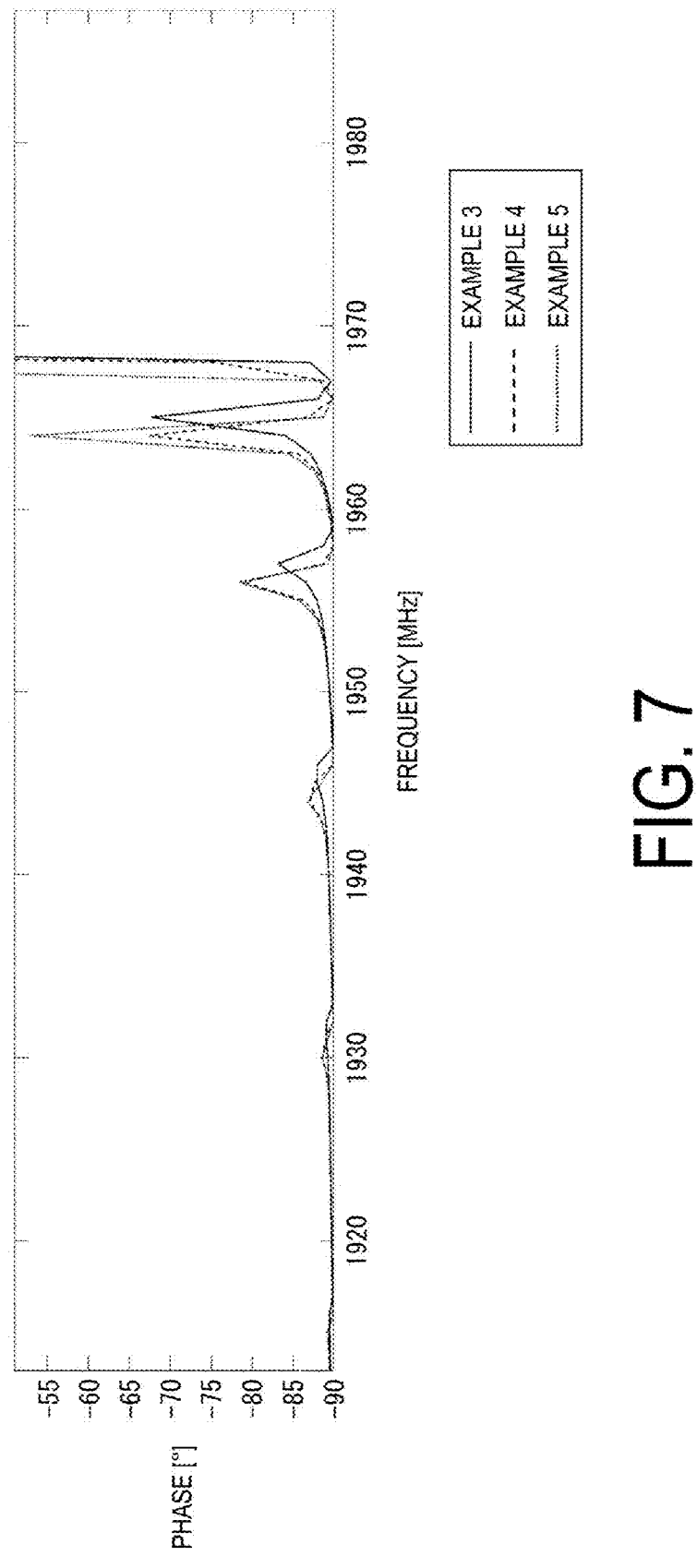
FIG. 7 is an enlarged view of a part of the graph showing the frequency characteristics of the elastic wave device according to the other example of the present disclosure.

The simulation results of the phase characteristics of the elastic wave devices according to Example 3, Example 4, and Example 5 are summarized in FIGS. 6 and 7. FIG. 6 is a graph showing phase characteristics of elastic wave devices according to Example 3, Example 4, and Example 5. FIG. 7 is a graph showing an enlarged region VII in the graph shown in FIG. 6. In FIGS. 6 and 7, the phase characteristics of the elastic wave devices according to Example 3, Example 4, and Example 5 are indicated by a solid line, a broken line, and a dotted line, respectively. In the graphs of FIGS. 6 and 7, the horizontal axes represent frequency and the vertical axes represent phase.

The elastic wave devices according to Example 3, Example 4, and Example 5 excite elastic waves having frequencies near the 2000 MHz as main vibration. As shown in the graph of FIG. 6, the phases near the 2000 MHz in the elastic wave devices according to Example 3, Example 4, and Example 5 are all near 90°. Thus, the elastic wave devices according to Example 3, Example 4, and Example 5 maintain excitation of the main vibration to some extent.

On the other hand, in the elastic wave devices according to Example 3, Example 4, and Example 5, elastic waves having frequencies equal to or lower than about 1970 MHz correspond to spurious signals. As shown in the graph of FIG. 7, in the elastic wave devices according to Examples 3 and 4, the phases of frequencies corresponding to some spurious signals are reduced as compared with the elastic wave device according to Example 5. As shown in the graph of FIG. 7, in the elastic wave device according to Example 4, the phase of frequency corresponding to some other spurious signals are reduced as compared with the elastic wave device according to Example 4. This corresponds to the fact that the reflection of the spurious signal on the first end surface 51 decreases as the height H1 decreases in the present embodiment, and thus the spurious signal leaks more efficiently from the piezoelectric body 2 to the outside of the elastic wave device 1.

Second Embodiment

An elastic wave device 1 according to another embodiment will be described below. For convenience of description below, members having the same functions as those of the members described in the above-described embodiment are denoted by the same reference signs, and description thereof is not repeated.

Support Substrate

Figure 8:
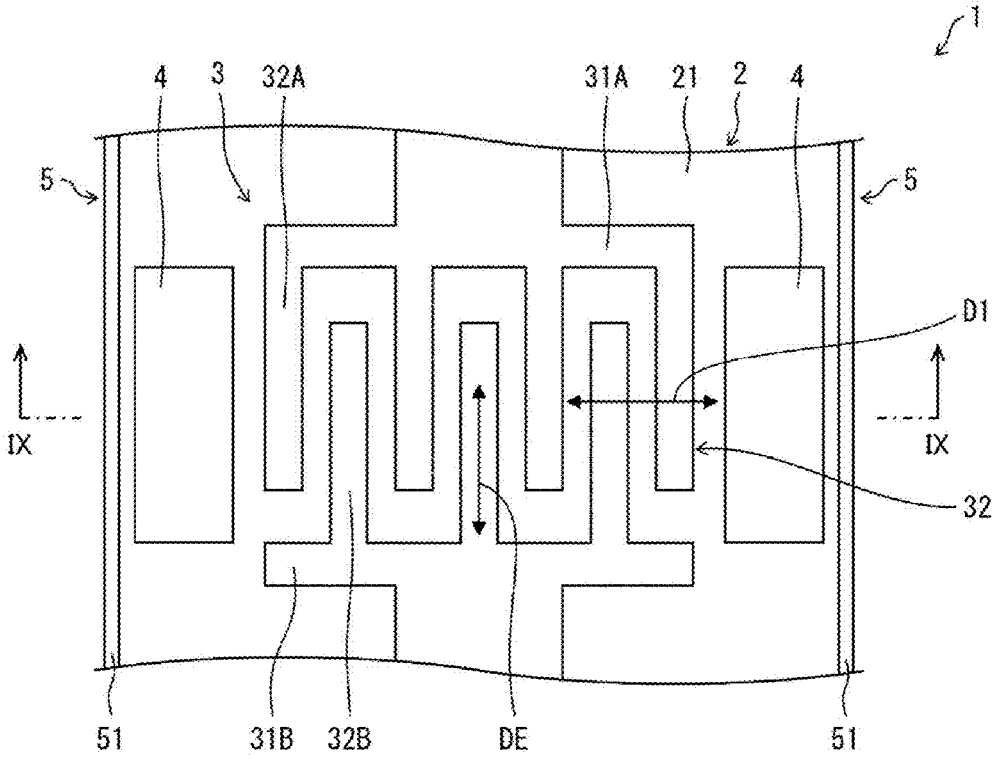
FIG. 8 is a schematic plan view of an elastic wave device according to a second embodiment of the present disclosure.
Figure 9:
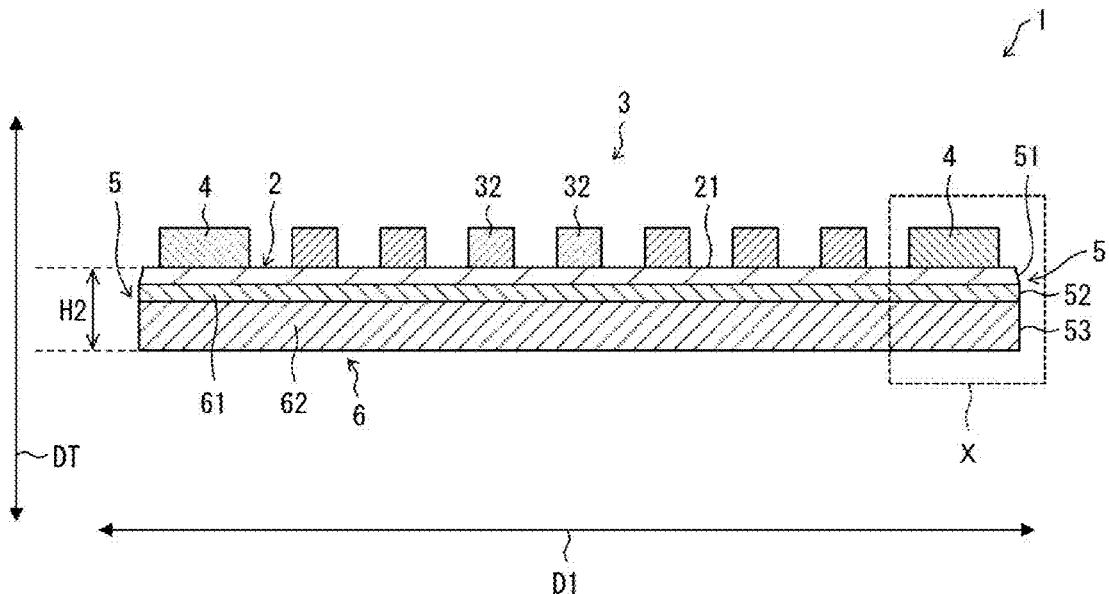
FIG. 9 is a schematic side cross-sectional view of the elastic wave device according to the second embodiment of the present disclosure.

FIG. 8 is a schematic plan view of the elastic wave device 1 according to the present embodiment. FIG. 9 is a schematic side cross-sectional view of the elastic wave device 1 according to the present embodiment, and particularly is a cross-sectional view taken along arrow line IX-IX shown in FIG. 9. In other words, FIG. 9 is a side cross-sectional view of the elastic wave device 1 on a plane parallel to a first direction D1 and a film thickness direction DT and a plane passing through a plurality of electrode fingers 32 and floating electrodes 4.

The elastic wave device 1 according to the present embodiment has the same configuration as that of the elastic wave device 1 according to the previous embodiment except that the elastic wave device 1 according to the present embodiment includes a support substrate 6 and that the configuration of a part of the piezoelectric body 2 is different accordingly.

The support substrate 6 is a substrate that supports the piezoelectric body 2 in the elastic wave device 1. The support substrate 6 includes, for example, a stack of a first layer 61 and a second layer 62. The first layer 61 is also referred to as a low acoustic velocity layer, and may be, for example, a silicon oxide ($SiO_2$) substrate. The second layer 62 may be, for example, a silicon substrate. A thickness of the second layer 62 may be greater than the thickness of the first layer 61.

The elastic wave device 1 includes, for example, the piezoelectric body 2 on a surface of the support substrate 6 closer to the first layer 61 than the second layer 62 in the film thickness direction DT. The piezoelectric body 2 has a first surface 21 on which electrodes including the IDT electrode 3 and the floating electrodes 4 are positioned on the side opposite to the support substrate 6.

The piezoelectric body 2 according to the present embodiment is supported by the support substrate 6. Thus, the elastic wave device 1 can reduce attenuation of elastic waves propagating through the piezoelectric body 2. Therefore, the elastic wave device 1 maintains the intensity of the main vibration propagating through the piezoelectric body 2 more efficiently.

In the present embodiment, an end surface 5 may include a second end surface 52 of a first layer 61 and a third end surface 53 of the second layer 62 in addition to the first end surface 51. In the present embodiment, the first end surface 51, the second end surface 52, and the third end surface 53 may be continuous. In the present embodiment, the end surface 5 has a height H2 from the lower end of the support substrate 6 on the side opposite to the piezoelectric body 2 to the upper end of the piezoelectric body 2 on the first surface 21 side in the film thickness direction DT. In other words, the height H2 is the height of the support substrate 6 from the lower surface on the side opposite to the first surface 21 to the first surface 21. The height H1 from the lower end to the upper end of the first end surface 51 in the film thickness direction DT according to the present embodiment is smaller than the height H1 according to the previous embodiment.

Figure 10:
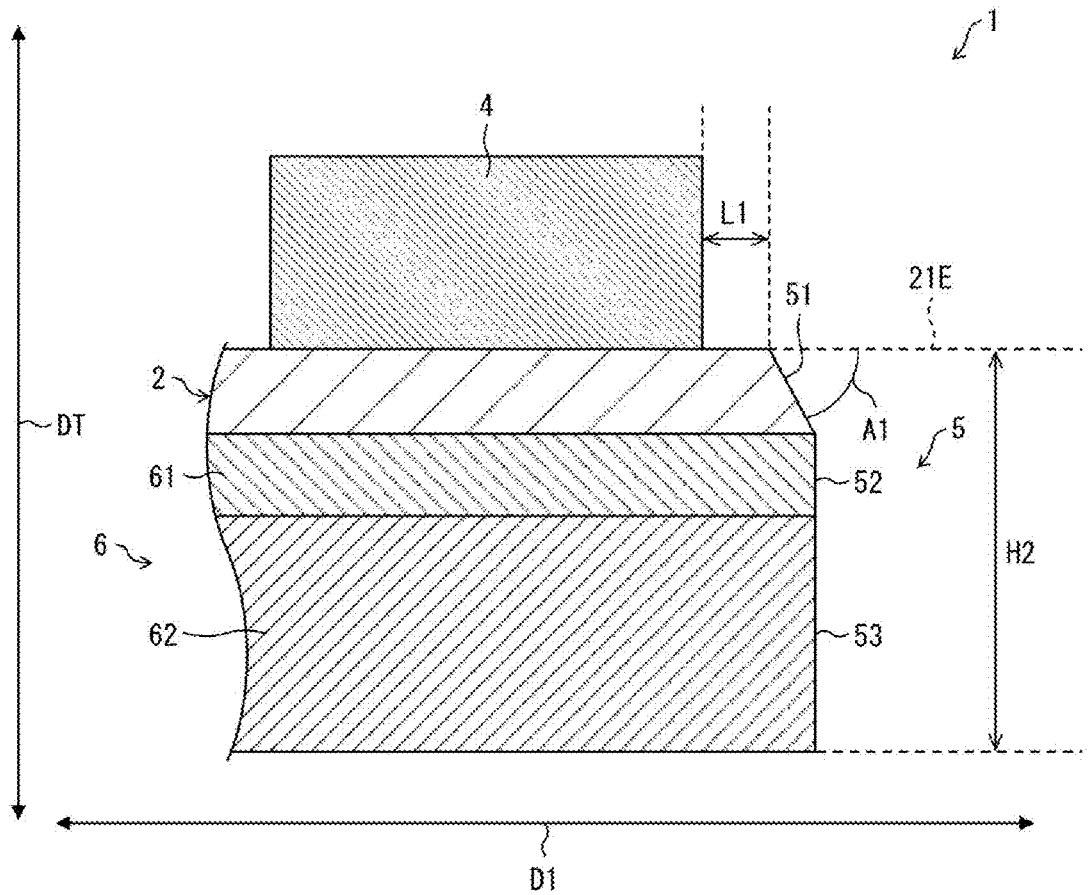
FIG. 10 is a schematic enlarged view of a side cross-section of the elastic wave device according to the second embodiment of the present disclosure.

The configuration of the elastic wave device 1 in the vicinity of the end surface 5 will be described in detail with reference to FIG. 10. FIG. 10 is a schematic enlarged view of a side cross-section of the elastic wave device 1 according to the present embodiment and a schematic view particularly showing the region X shown in FIG. 9, in other words, the vicinity of the end surface 5 on the first side in the first direction D1. In other words, FIG. 1 illustrates a part of a cross-section of the elastic wave device 1 according to the present embodiment, which is parallel to the first direction D1 and the film thickness direction DT. In the present embodiment, the end surface 5 positioned on the second side in the first direction D1 may have the same configuration as the end surface 5 illustrated in FIG. 10 except that the left and right sides in the first direction D1 are reversed.

Also in the present embodiment, the first angle A1 is less than 90° as illustrated in FIG. 10. For the same reason as described above, the elastic wave device 1 reduces spurious signals propagating through the piezoelectric body 2.

In addition, when the average value of the intervals between the plurality of electrode fingers 32 in the first direction D1 is set to a pitch p, a height H2 of the end surface 5 is 0.5 p or higher and 2.0 p or less in the present embodiment. Since the height H2 is 2.0 p or less, some of the spurious signals of the elastic wave propagating through the piezoelectric body 2 are reflected on the first end surface 51 and then easily leak to the outside of the elastic wave device 1. Therefore, the elastic wave device 1 more reduces the spurious signals propagating through the piezoelectric body 2.

On the other hand, part of main vibration of elastic waves propagating through the piezoelectric body 2 is reflected on the first end surface 51 and then propagates toward the support substrate 6. However, since the height H2 is 0.5 p or higher, the main vibration propagating toward the support substrate 6 is reflected at any portion of the support substrate 6 toward the piezoelectric body 2. For this reason, most of the main vibration propagating through the piezoelectric body 2 propagates through the piezoelectric body 2 even after being reflected on the first end surface 51. Therefore, the elastic wave device 1 maintains the intensity of the main vibration propagating through the piezoelectric body 2.

As described above, the elastic wave device 1 in which the first angle A1 is smaller than 90° and the height H2 is 0.5 p or higher and 2.0 p or less reduces the intensity of the spurious signals of the elastic waves propagating through the piezoelectric body 2 while maintaining the intensity of the main vibration. Therefore, the frequency characteristics of the elastic wave device 1 are improved by the above configuration. From the viewpoint of further maintaining the intensity of the main vibration propagating through the piezoelectric body 2, the first angle A1 may be 80° or greater.

Comparative Verification Between Examples and Comparative Example: When Support Substrate is Provided In order to confirm the improvement of the frequency characteristics of the elastic wave device 1 according to the present embodiment, the frequency characteristics of the elastic wave devices according to an example and a comparative example were compared and verified by simulation.

In the present embodiment, the frequency characteristics of the elastic wave devices according to Example 6, Example 7, and Comparative Example 2 were compared and verified. Each of the elastic wave devices according to Example 6, Example 7, and Comparative Example 2 has the same configuration as the elastic wave device 1 according to the present embodiment except for the value of the first angle A1. In each of the above-described elastic wave devices, the thickness T1 was set to 7% of the total thicknesses of the elastic wave devices, the duty ratio was set to 0.50, the width W2 was set to 1.26 p, the cut angle of the piezoelectric body 2 was set to 50°, and the total number of the electrode fingers 32 was set to 200. In each of the elastic wave devices described above, the thickness of the piezoelectric body 2 was set to 0.5 p, the thickness of the first layer 61 was set to 0.25 p, and the thickness of the second layer 62 was set to sufficiently thicker than the first layer 61. In each of the elastic wave devices, the second layer 62 was a silicon substrate, and the orientation of Si in the silicon substrate was [111]. In each of Example 6, Example 7, and Comparative Example 2, the first angle A1 was set to 70°, 80°, and 90°, respectively.

Figure 11:
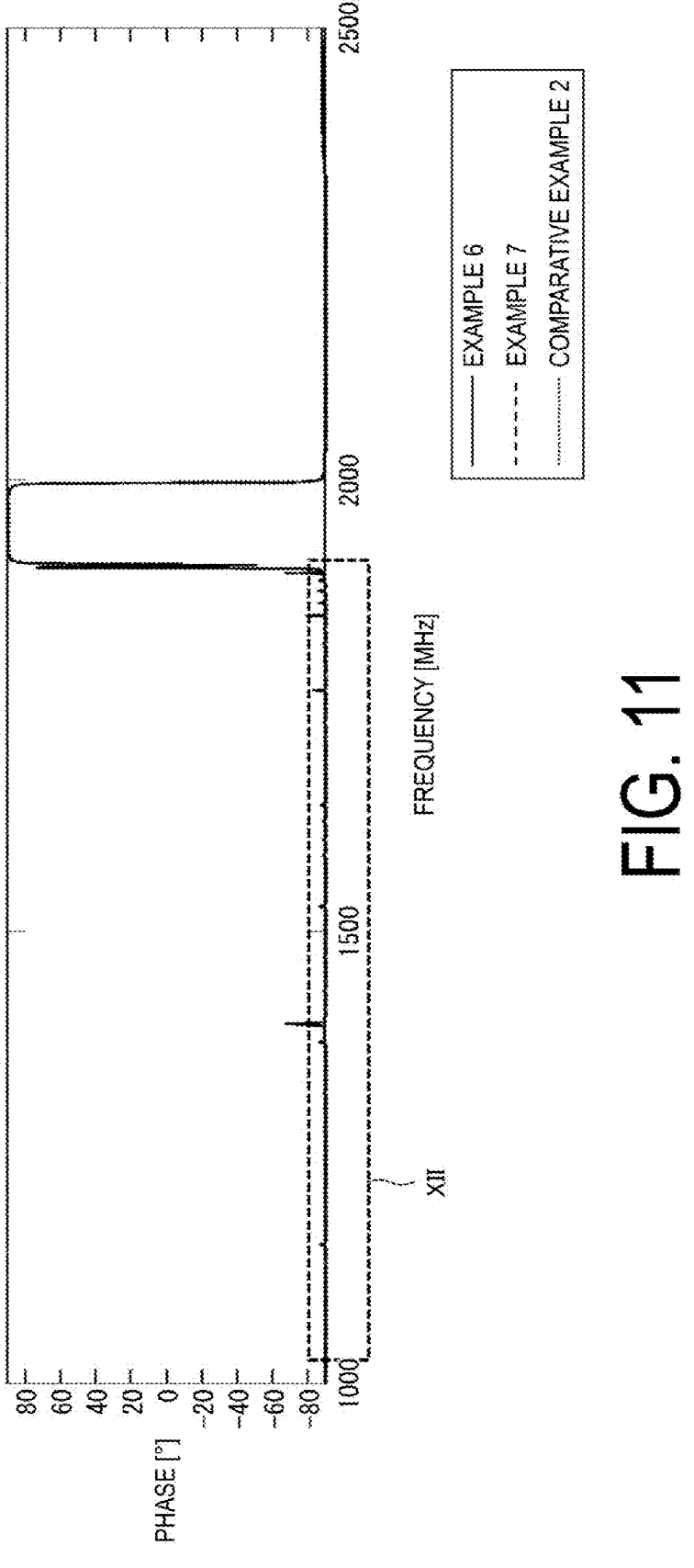
FIG. 11 is a graph showing frequency characteristics of elastic wave devices according to other examples and a comparative example of the present disclosure.
Figure 12:
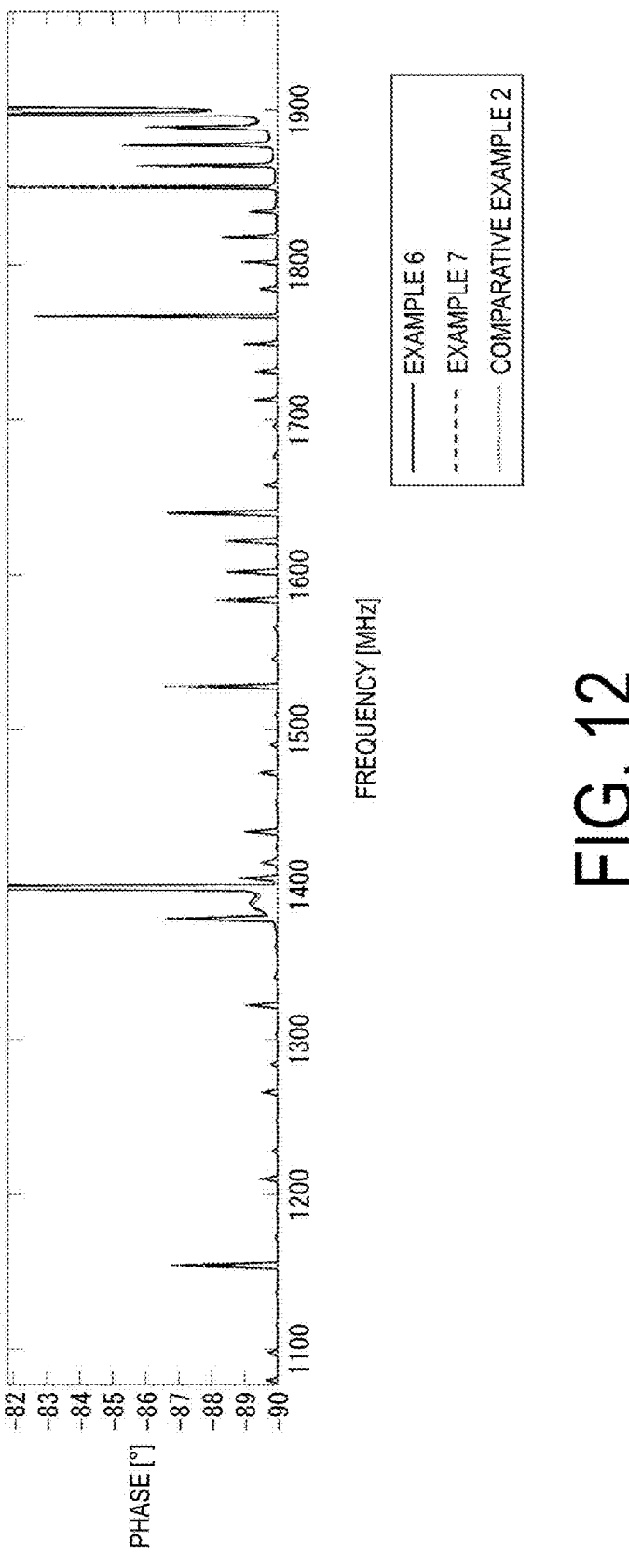
FIG. 12 is an enlarged view of a part of the graph showing the frequency characteristics of the elastic wave devices according to the other examples and the comparative example of the present disclosure.

The simulation results of the phase characteristics of the elastic wave devices according to Example 6, Example 7, and Comparative Example 2 are summarized in FIGS. 11 and 12. FIG. 11 is a graph showing phase characteristics of the elastic wave devices according to Example 6, Example 7, and Comparative Example 2. FIG. 12 is a graph showing an enlarged region XII in the graph shown in FIG. 11. In FIGS. 11 and 12, the phase characteristics of the elastic wave devices according to Example 6, Example 7, and Comparative Example 2 are indicated by a solid line, a broken line, and a dotted line, respectively. In the graphs of FIGS. 11 and 12, the horizontal axes represent frequency and the vertical axes represent phase.

The elastic wave devices according to Example 6, Example 7, and Comparative Example 2 excite elastic waves having frequencies near the 1950 MHz as main vibration. As shown in the graph of FIG. 11, the phases near the 1950 MHz in the elastic wave devices according to Example 6 and Example 7 are near 90°, which is substantially the same as the phases near the 1950 MHz in the elastic wave device according to Comparative Example 2. Thus, the elastic wave devices according to Examples 6 and 7 maintain the excitation of the main vibration to some extent as compared with the elastic wave device according to Comparative Example 2.

On the other hand, in the elastic wave devices according to Example 6, Example 7, and Comparative Example 2, elastic waves having frequencies of about 1900 MHz or lower correspond to spurious signals. As shown in the graph of FIG. 12, in the elastic wave devices according to Examples 6 and 7, the phases of frequencies corresponding to some spurious signals are reduced as compared with the elastic wave device according to Comparative Example 2. Thus, the elastic wave devices according to Examples 6 and 7 reduce the excitation of the spurious signals, as compared with the elastic wave device according to Comparative Example 2.

Third Embodiment

Electrode Finger Serving as End-Portion Electrode

Figure 13:
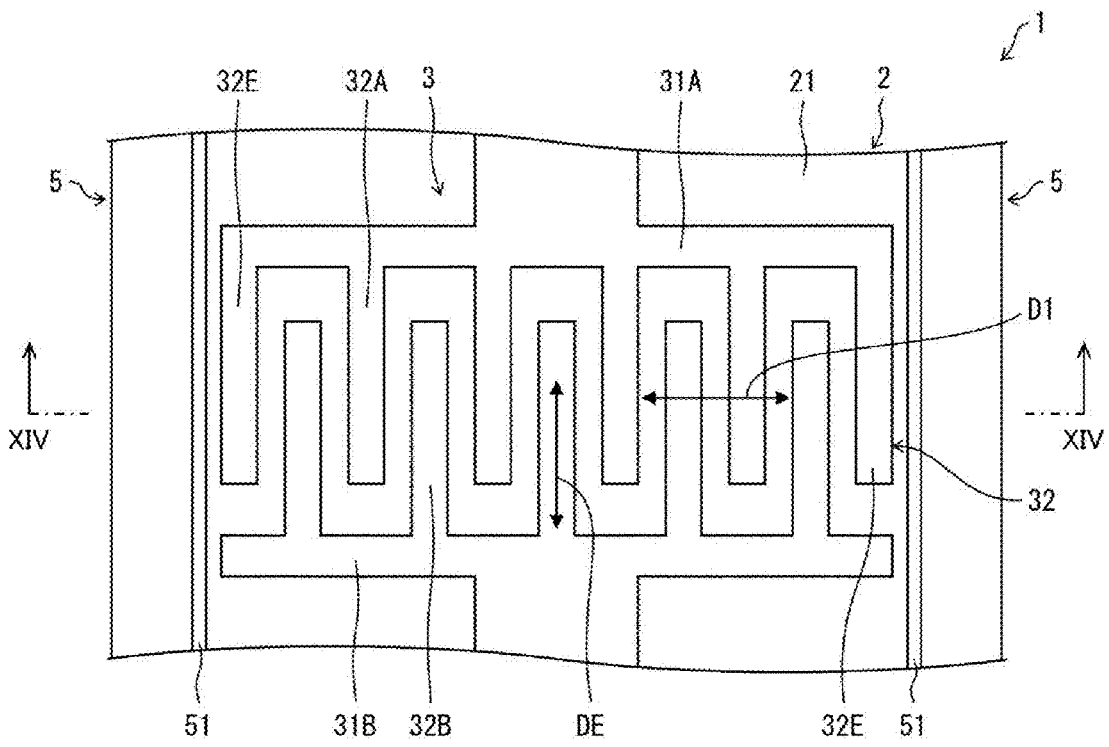
FIG. 13 is a schematic plan view of an elastic wave device according to a third embodiment of the present disclosure.
Figure 14:
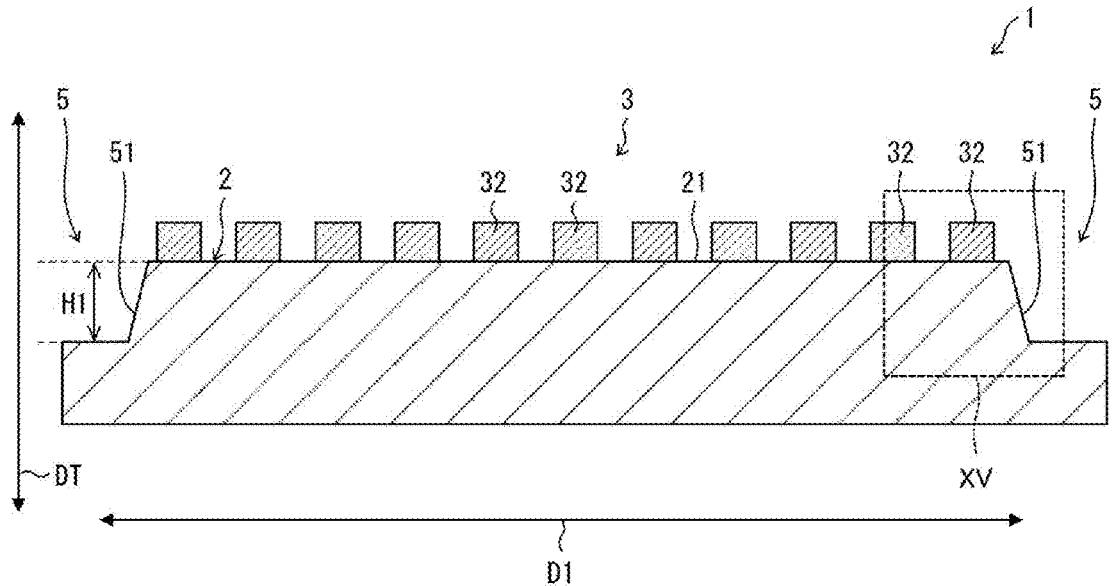
FIG. 14 is a schematic side cross-sectional view of an elastic wave device according to the third embodiment of the present disclosure.

FIG. 13 is a schematic plan view of the elastic wave device 1 according to the present embodiment. FIG. 14 is a schematic side cross-sectional view of the elastic wave device 1 according to the present embodiment, and particularly is a cross-sectional view taken along arrow line XIV-XIV illustrated in FIG. 13. In other words, FIG. 14 is a side cross-sectional view of the elastic wave device 1 on a plane parallel to the first direction D1 and the film thickness direction DT and a plane passing through a plurality of electrode fingers 32.

The elastic wave device 1 according to the present embodiment has the same configuration as that of the elastic wave device 1 according to the first embodiment except that the floating electrodes 4 are not provided and the configuration of the IDT electrode 3 is different. In particular, in the present embodiment, the electrode finger 32E, which is a part of the plurality of electrode fingers 32 in the IDT electrode 3, is positioned near the first end surface 51 at each of both end portions in the first direction D1. For this reason, in the present embodiment, the electrode fingers 32E are end-portion electrodes.

Figure 15:
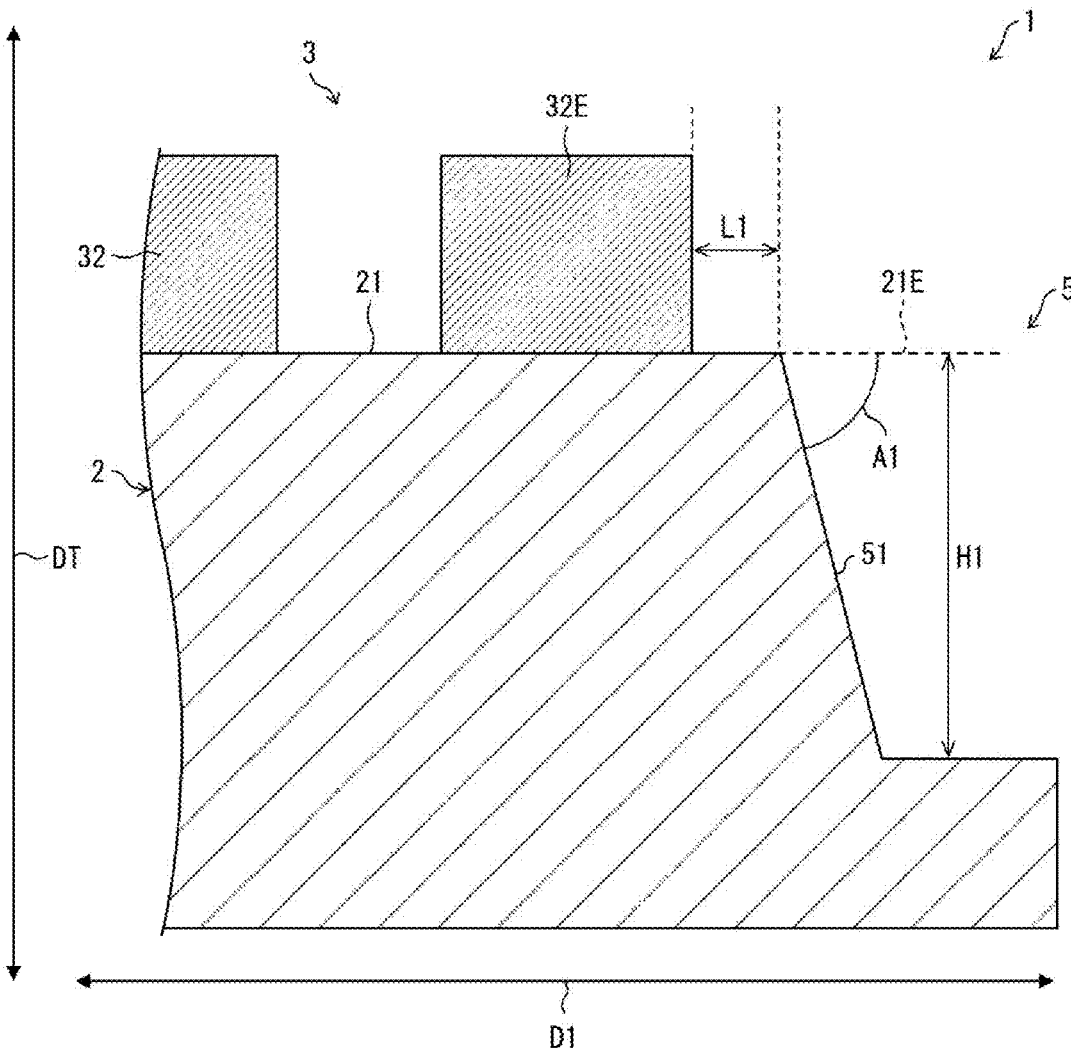
FIG. 15 is a schematic enlarged view of a side cross-section of the elastic wave device according to the third embodiment of the present disclosure.

FIG. 15 is a schematic enlarged view of a side cross-section of the elastic wave device 1 according to the present embodiment and a schematic view particularly showing the region XV shown in FIG. 14, in other words, the vicinity of the first end surface 51 on the first side in the first direction D1. In other words, FIG. 15 illustrates a part of a cross-section of the elastic wave device 1 according to the present embodiment, which is parallel to the first direction D1 and the film thickness direction DT.

In the present embodiment, the first angle A1 is smaller than 90°. When the average value of the intervals between the plurality of electrode fingers 32 in the first direction D1 is assumed to be the pitch p, the distance L1 that is the shortest distance between the electrode finger 32E as an end-portion electrode and the first end surface 51 is 5 p or shorter. Thus, for the same reason as described above, the frequency characteristics of the elastic wave device 1 according to the present embodiment are improved. From the viewpoint of further maintaining the intensity of the main vibration propagating through the piezoelectric body 2, the first angle A1 may be 80° or greater.

The electrode finger 32E according to the present embodiment is an end-portion electrode and a part of the electrode finger 32, in other words, a part of the IDT electrode 3. Therefore, the shape or arrangement pattern of the electrode finger 32E can be made the same as any one of the electrode fingers 32 of the IDT electrode 3 having the function of exciting the main vibration, for example. For this reason, the electrode finger 32E reduces the occurrence of spurious signals in the vicinity thereof and simplifies the arrangement pattern of the electrodes on the first surface 21, thereby further simplifying the structure of the electrodes.

In the present embodiment, the first angle A1 is 70° or greater. The height H1 may be 0.5 p or higher and 2.0 p or less.

Communication Device

Figure 16:
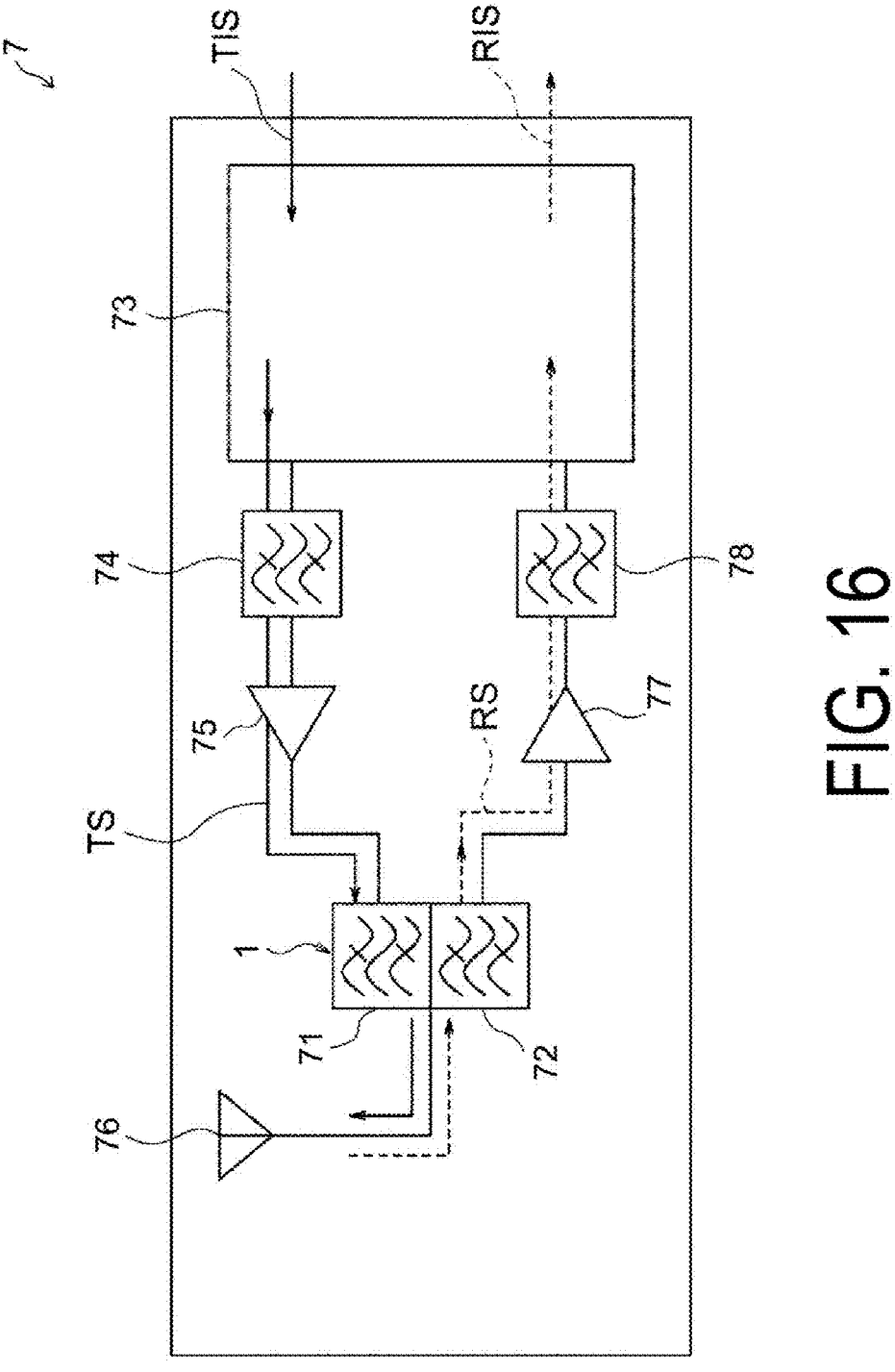
FIG. 16 is a schematic view of a communication device according to each embodiment of the present disclosure.

FIG. 16 is a configuration example of a communication device 7 according to each embodiment of the present disclosure. The communication device 7 performs wireless communication using radio waves. The communication device 7 includes the elastic wave device 1 according to at least one embodiment of the present disclosure. For example, each of the transmission filter 71 and the reception filter 72 in FIG. 16 may include the elastic wave device 1 as a frequency filter.

In the communication device 7, a radio frequency-integrated circuit (RF-IC) 73 may convert, into a transmitted signal TS, a transmission information signal TIS including information to be transmitted, by modulating the transmission information signal TIS and increasing the frequency thereof. The modulation and the frequency increase of the transmission information signal TIS by the RF-IC 73 may be a conversion into a high-frequency signal having a carrier frequency. A band-pass filter 74 may remove, from the transmitted signal TS, unnecessary components other than a transmission passband. Subsequently, the transmitted signal TS from which unnecessary components have been removed may be amplified by an amplifier 75 and input to the transmission filter 71.

The transmission filter 71 may remove, from the transmitted signal TS input through a transmission terminal, unnecessary components other than the transmission passband. The transmission filter 71 may output the transmitted signal TS from which unnecessary components have been removed, to an antenna 76 via, for example, an antenna terminal which is not illustrated. The antenna 76 may convert the transmitted signal TS, which is an electrical signal input to the antenna 76, into a radio wave as a radio signal, and transmit the radio wave to the outside of the communication device 7.

The antenna 76 can also convert a radio wave received from the outside into a received signal RS which is an electrical signal. The antenna 76 may input the received signal RS to a reception filter 72 via, for example, the above-described antenna terminal. The reception filter 72 may remove, from the input received signal RS, unnecessary components other than a reception passband. The reception filter 72 may output the received signal RS from which unnecessary components have been removed, to an amplifier 77. The output received signal RS may be amplified by the amplifier 77 and then input to a band-pass filter 78. The band-pass filter 78 may remove, from the amplified received signal RS, unnecessary components other than the reception passband. The RF-IC 73 may convert, into a reception information signal RIS, the received signal RS from which unnecessary components have been removed, by decreasing the frequency and demodulating the received signal RS.

The transmission information signal TIS and the reception information signal RIS may be low-frequency signals including appropriate information including baseband signals. For example, the transmission information signal TIS and the reception information signal RIS may be analog audio signals or digitized audio signals. The passband of radio signals may be appropriately set or may conform to various known standards.

The frequency characteristics of the elastic wave device 1 installed in the communication device 7 according to the present disclosure are improved for the reasons described above. Therefore, the frequency characteristics of the communication device 7 according to the present disclosure are improved.

Conclusion

In a first aspect of the present disclosure, an elastic wave device includes a piezoelectric body having a first surface; and an electrode including an IDT electrode including a plurality of electrode fingers arrayed on the first surface, in which the piezoelectric body has a first end surface connected to the first surface, the first end surface being an end surface positioned on a first side in a first direction orthogonal to an extending direction of any of the plurality of electrode fingers among directions parallel to the first surface, and on a cross-section obtained by cutting the piezoelectric body on a plane parallel to the first direction and perpendicular to the first surface, a first angle formed by an extended line of the first surface in the first direction and a tangential line at any point on the first end surface is 70° or greater and less than 90°.

In a second aspect of the present disclosure, the elastic wave device in the first aspect may have a configuration in which the first angle is 80° or greater and less than 90°.

In a third aspect of the present disclosure, the elastic wave device in the second aspect may have a configuration in which the first angle is 88° or greater and less than 90°.

In a fourth aspect of the present disclosure, an elastic wave device includes a piezoelectric body having a first surface; and an electrode including an IDT electrode including a plurality of electrode fingers arrayed on the first surface, in which the piezoelectric body has a first end surface connected to the first surface, the first end surface being an end surface positioned on a first side in a first direction orthogonal to an extending direction of any of the plurality of electrode fingers among directions parallel to the first surface, on a cross-section obtained by cutting the piezoelectric body on a plane parallel to the first direction and perpendicular to the first surface, a first angle formed by an extended line of the first surface in the first direction and a tangential line at any point on the first end surface is less than 90°, and when an average value of intervals of the plurality of electrode fingers in the first direction is set to p, a height of the first end surface is 0.5 p or higher and 2.0 p or less.

In a fifth aspect of the present disclosure, the elastic wave device in the fourth aspect may have a configuration in which the first angle is 80° or greater and less than 90°.

In a sixth aspect of the present disclosure, an elastic wave device includes a support substrate; a piezoelectric body positioned on the support substrate and having a first surface opposite to the support substrate; and an electrode including an IDT electrode including a plurality of electrode fingers arrayed on the first surface, in which the piezoelectric body has a first end surface connected to the first surface, the first end surface being an end surface positioned on a first side in a first direction orthogonal to an extending direction of any of the plurality of electrode fingers among directions parallel to the first surface, on a cross-section obtained by cutting the piezoelectric body on a plane parallel to the first direction and perpendicular to the first surface, a first angle formed by an extended line of the first surface in the first direction and a tangential line at any point on the first end surface is less than 90°, and when an average value of intervals of the plurality of electrode fingers in the first direction is set to p, a height from a lower surface of the support substrate opposite to the first surface to the first surface is 0.5 p or higher and 2.0 p or less.

In a seventh aspect of the present disclosure, the elastic wave device in the sixth aspect may have a configuration in which the first angle is 80° or greater and less than 90°.

In an eighth aspect of the present disclosure, an elastic wave device includes a piezoelectric body having a first surface; and an electrode including an IDT electrode including a plurality of electrode fingers arrayed on the first surface, in which the piezoelectric body has a first end surface connected to the first surface, the first end surface being an end surface positioned on a first side in a first direction orthogonal to an extending direction of any of the plurality of electrode fingers among directions parallel to the first surface, on a cross-section obtained by cutting the piezoelectric body on a plane parallel to the first direction and perpendicular to the first surface, a first angle formed by an extended line of the first surface in the first direction and a tangential line at any point on the first end surface is less than 90°, the electrode includes an end-portion electrode closest to the first end surface, and when an average value of intervals of the plurality of electrode fingers in the first direction is set to p, a shortest distance between the end-portion electrode and the first end surface is 5 p or shorter.

In a ninth aspect of the present disclosure, the elastic wave device in the eighth aspect may have a configuration in which the shortest distance is 1 p or shorter.

In a tenth aspect of the present disclosure, the elastic wave device in the ninth aspect may have a configuration in which the shortest distance is 0.1 p or shorter.

In an eleventh aspect of the present disclosure, a communication device may include the elastic wave device according to any one of the first to tenth aspects.

In a twelfth aspect of the present disclosure, a piezoelectric substrate includes a piezoelectric body having a first surface, in which the piezoelectric body has a first end surface connected to the first surface, the first end surface being an end surface positioned on a first side in a first direction that is a direction parallel to the first surface, and on a cross-section obtained by cutting the piezoelectric body on a plane parallel to the first direction and perpendicular to the first surface, a first angle formed by an extended line of the first surface in the first direction and a tangential line at any point on the first end surface is 70° or greater and less than 90°.

The invention according to the present disclosure has been described above based on the drawings and examples. However, the invention according to the present disclosure is not limited to each embodiment described above. That is, the embodiments of the invention according to the present disclosure can be modified in various ways within the scope illustrated in the present disclosure, and embodiments obtained by appropriately combining the technical means disclosed in different embodiments are also included in the technical scope of the invention according to the present disclosure. In other words, it should be noted that a person skilled in the art can easily make different variations or modifications based on the present disclosure. Note that these variations or modifications are included within the scope of the present disclosure. For example, the elastic wave device 1 according to any of the embodiments different from the second embodiment may include the support substrate 6 described in the second embodiment, and the piezoelectric body 2 may be positioned on support substrate 6.

REFERENCE SIGNS

1 Elastic wave device
2 Piezoelectric body
3 IDT electrode
4 Floating electrode
5 End surface
6 Support substrate
7 Communication device
21 First surface
21E Extended line
32 Electrode finger
51 First end surface
A1 First angle
D1 First direction
D2 Second direction

The invention claimed is:

1. An elastic wave device comprising:
a piezoelectric substrate having a piezoelectric body having an upper surface and a first end surface connected to an upper surface, and
an electrode comprising an IDT electrode comprising a plurality of electrode fingers arrayed on the upper surface,
wherein the first end surface is positioned outside of the IDT electrode, as viewed in a plan view, in a first direction, the first direction is orthogonal to an extending direction of any of the plurality of electrode fingers, as viewed in the plan view,
a first angle formed by an extended line of the upper surface in the first direction and a tangential line at any point on the first end surface is 70° or greater and less than 90° on a cross-section obtained by cutting the piezoelectric body parallel to the first direction and perpendicular to the upper surface, and
the IDT electrode is not enclosed by the first end surface together with any other end surfaces of the piezoelectric body, as viewed in a plan view.

2. The elastic wave device according to claim 1, wherein the first angle is 80° or greater and less than 90°.

3. The elastic wave device according to claim 1, wherein the first angle is 88° or greater and less than 90°.

4. The elastic wave device according to claim 1, wherein the piezoelectric substrate has a groove portion and the first end surface is a portion of the groove portion.

5. The elastic wave device according to claim 1, wherein, the piezoelectric substrate has a support substrate and the support substrate is positioned on the piezoelectric body.

6. The elastic wave device according to claim 5, wherein the support substrate has a first layer and a second layer positioned under the first layer.

7. The elastic wave device according to claim 6, wherein a thickness of the second layer is greater than a thickness of the first layer.

8. The elastic wave device according to claim 6, wherein the first layer has a second end surface positioned outside of the IDT electrode in the first direction.

9. The elastic wave device according to claim 8, wherein the first end surface and the second end surface are continuous.

10. The elastic wave device according to claim 8 comprising:
a groove portion of the piezoelectric substrate
the first end surface and the second end surface are portions of the groove portion.

11. The elastic wave device according to claim 1 wherein
when an average value of intervals of the plurality of electrode fingers in the first direction is set to p, a height of the first end surface is 0.5 p or higher and 2.0 p or less.

12. The elastic wave device according to claim 1 wherein
the electrode comprises an end-portion electrode closest to the first end surface, and
when an average value of intervals of the plurality of electrode fingers in the first direction is set to p, a shortest distance between the end-portion electrode and the first end surface is 5 p or shorter.

13. The elastic wave device according to claim 12, wherein
the shortest distance is 1 p or shorter.

14. The elastic wave device according to claim 12, wherein
the shortest distance is 0.1 p or shorter.

15. The elastic wave device according to claim 1, wherein a grating reflector is not located between the IDT electrode and the first end surface in the first direction.

16. An elastic wave device comprising:
a piezoelectric substrate having a piezoelectric body having an upper surface and a first end surface connected to the upper surface; and
an electrode comprising an IDT electrode comprising a plurality of electrode fingers arrayed on the upper surface,
wherein the first end surface is positioned outside of the IDT electrode, as viewed in a plan view, in a first direction the first direction is orthogonal to an extending direction of any of the plurality of electrode fingers, as viewed in the plan view,
a first angle formed by an extended line of the upper surface in the first direction and a tangential line at any point on the first end surface is less than 90° on a cross-section obtained by cutting the piezoelectric body parallel to the first direction and perpendicular to the upper surface,
when an average value of intervals of the plurality of electrode fingers in the first direction is set to p, a height of the first end surface is 0.5 p or higher and 2.0 p or less, and
the IDT electrode is not enclosed by the first end surface together with any other end surfaces of the piezoelectric body, as viewed in a plan view.

17. An elastic wave device comprising:
a piezoelectric body having a piezoelectric body having an upper surface and a first end surface connected to the upper surface; and
an electrode comprising an IDT electrode comprising a plurality of electrode fingers arrayed on the upper surface,
wherein the first end surface is positioned outside of the IDT electrode, as viewed in a plan view, in a first direction the first direction is orthogonal to an extending direction of any of the plurality of electrode fingers, as viewed in the plan view,
a first angle formed by an extended line of the upper surface in the first direction and a tangential line at any point on the first end surface is less than 90° on a cross-section obtained by cutting the piezoelectric body parallel to the first direction and perpendicular to the upper surface,
wherein the electrode comprises an end-portion electrode closest to the first end surface,
when an average value of intervals of the plurality of electrode fingers in the first direction is set to p, a shortest distance between the end-portion electrode and the first end surface is 5 p or shorter, and
the IDT electrode is not enclosed by the first end surface together with any other end surfaces of the piezoelectric body, as viewed in a plan view.

18. The elastic wave device according to claim 17, wherein the shortest distance is 1 p or shorter.

19. The elastic wave device according to claim 17, wherein the shortest distance is 0.1 p or shorter.

20. An elastic device comprising
a piezoelectric substrate having a piezoelectric body having an upper surface and a first end surface connected to an the upper surface, and
an electrode comprising an IDT electrode comprising a plurality of electrode fingers arrayed on the upper surface, wherein the first end surface is positioned outside of the IDT electrode, as viewed in a plan view, in the first direction, the first direction is orthogonal to an extending direction of any of the plurality of electrode fingers, as viewed in a plan view, a first angle formed by an extended line of the upper surface in the first direction and a tangential line at any point on the first end surface is 70° or greater and less than 90° on a cross-section obtained by cutting the piezoelectric body parallel to the first direction and perpendicular to the upper surface, and wherein a grating reflector is not located between the IDT electrode and the first end surface in the first direction.

21. The elastic wave device according to claim 20, wherein the first angle is 80° or greater and less than 90°.

22. The elastic wave device according to claim 20, wherein the first angle is 88° or greater and less than 90°.

23. The elastic wave device according to claim 20, wherein the piezoelectric substrate has a groove portion and the first end surface is a portion of the groove portion.

24. The elastic wave device according to claim 20, wherein the piezoelectric substrate has a support substrate and the support substrate is positioned on the piezoelectric body.

25. The elastic wave device according to claim 24, wherein the support substrate has a first layer and a second layer positioned under the first layer.

26. The elastic wave device according to claim 25, wherein a thickness of the second layer is greater than a thickness of the first layer.

27. The elastic wave device according to claim 25, wherein the first layer has a second end surface positioned outside of the IDT electrode in the first direction.

28. The elastic wave device according to claim 27, wherein the first end surface and the second end surface are continuous.

29. The elastic wave device according to claim 27, comprising a groove portion of the piezoelectric substrate, and wherein the first end surface and the second end surface are portion of the groove portion.

* * * * *